US011171654B1

(12) United States Patent
Hinrichs

(10) Patent No.: US 11,171,654 B1
(45) Date of Patent: Nov. 9, 2021

(54) DELAY LOCKED LOOP WITH SEGMENTED DELAY CIRCUIT

(71) Applicant: QUALCOMM Incorporated, San Diego, CA (US)

(72) Inventor: Jeffrey Mark Hinrichs, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/319,926

(22) Filed: May 13, 2021

(51) Int. Cl.
*H03L 7/081* (2006.01)
*H03L 7/085* (2006.01)

(52) U.S. Cl.
CPC ............ *H03L 7/0818* (2013.01); *H03L 7/085* (2013.01); *H03L 7/0814* (2013.01); *H03L 7/0816* (2013.01)

(58) Field of Classification Search
CPC ... H03L 7/0818; H03L 7/0814; H03L 7/0816; H03L 7/085
USPC ......................................................... 327/158
See application file for complete search history.

(56) References Cited

U.S. PATENT DOCUMENTS

| | | | | |
|---|---|---|---|---|
| 6,687,185 B1* | 2/2004 | Keeth | .................. | G11C 7/1051 327/147 |
| 7,065,001 B2* | 6/2006 | Johnson | .............. | G11C 11/4072 365/189.15 |
| 7,701,274 B2* | 4/2010 | Chae | ..................... | H03L 7/0814 327/158 |
| 7,970,090 B1* | 6/2011 | Tetzlaff | ................... | H04L 7/033 375/359 |
| 9,209,958 B1 | 12/2015 | Palaskas et al. | | |
| 9,531,363 B2* | 12/2016 | Miyano | ..................... | H03K 5/14 |
| 9,601,170 B1* | 3/2017 | Mazumder | ........... | G11C 7/1084 |
| 10,224,938 B2* | 3/2019 | Takahashi | ............... | H03L 7/091 |
| 10,467,158 B2* | 11/2019 | Kim | ........................ | G11C 7/222 |
| 2008/0232179 A1* | 9/2008 | Kwak | ................... | H03L 7/0816 365/194 |
| 2011/0304365 A1* | 12/2011 | Bunch | ................... | H03L 7/1976 327/157 |
| 2015/0357017 A1* | 12/2015 | Diffenderfer | ........ | G11C 7/1066 365/194 |
| 2016/0006444 A1* | 1/2016 | Zhou | ..................... | H03L 7/0816 327/158 |

* cited by examiner

*Primary Examiner* — Adam D Houston
(74) *Attorney, Agent, or Firm* — Loza & Loza, LLP

(57) ABSTRACT

A system includes delay locked loop (DLL) including a phase detector having a first input coupled to an input of the DLL, and a first delay circuit and a second delay circuit coupled in series between the input of the DLL and a second input of the phase detector. The DLL further includes a first control circuit, wherein an input of the first control circuit is coupled to an output of the phase detector, a first output of the first control circuit is coupled to a control input of the first delay circuit, and a second output of the first control circuit is coupled to a control input of the second delay circuit. The system also includes a second control circuit having an input coupled to the first control circuit, and a slave delay circuit having a control input coupled to an output of the second control circuit.

29 Claims, 22 Drawing Sheets

DELAY LOCKED LOOP WITH SEGMENTED DELAY CIRCUIT

BACKGROUND

Field

Aspects of the present disclosure relate generally to delay circuits, and, more particularly, to segmented delay circuits.

Background

A delay circuit may be used to delay a signal by an adjustable (i.e., tunable) delay. The adjustable delay may be used, for example, to adjust the timing of a first signal relative to a second signal by delaying the first signal by a corresponding amount. When the signal being delayed is a periodic signal, the delay may be described in terms of a change in the phase of the signal.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes delay locked loop (DLL) including a phase detector having a first input, a second input, and an output, wherein the first input of the phase detector is coupled to an input of the DLL. The DLL also includes a first delay circuit, and a second delay circuit, wherein the first delay circuit and the second delay circuit are coupled in series between the input of the DLL and the second input of the phase detector. The DLL further includes a first control circuit having an input, a first output, and a second output, wherein the input of the first control circuit is coupled to the output of the phase detector, the first output of the first control circuit is coupled to a control input of the first delay circuit, and the second output of the first control circuit is coupled to a control input of the second delay circuit. The system also includes a second control circuit having an input and an output, wherein the input of the second control circuit is coupled to the first control circuit. The system also includes a slave delay circuit having a control input coupled to the output of the second control circuit.

A second relates to a method of operating a system. The system includes a delay locked loop (DLL) and a slave delay circuit, the DLL including a phase detector, a first delay circuit, and a second delay circuit, wherein a first input of the phase detector is coupled to an input of the DLL, and the first delay circuit and the second delay circuit are coupled in series between the input of the DLL and a second input of the phase detector. The method includes receiving a phase-error signal from an output of the phase detector, adjusting a first delay control signal based on the phase-error signal, outputting a first portion of the first delay control signal to a control input of the first delay circuit, outputting a second portion of the first delay control signal to a control input of the second delay circuit, generating a second delay control signal based on the first delay control signal, and outputting the second delay control signal to a control input of the slave delay circuit.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A delay circuit may be used to delay a signal by an adjustable (i.e., tunable) delay. The adjustable delay may be used, for example, to adjust the timing of a first signal relative to a second signal by delaying the first signal by a corresponding amount. For example, a delay circuit may be used in a data interface that includes a latch configured to latch (i.e., capture) data bits from a data signal on edges of a clock signal. In this example, the delay circuit may be used to adjust the timing of the clock signal to center the edges of the clock signal between transitions of the data signal. In another example, one or more delay circuits may be used at a data interface that receives multiple data signals in parallel. In this example, the received data signals may be misaligned in time and the one or more delay circuits may be used to adjust the timing of the data signals to realign the data signals. It is to be appreciated that the present disclosure is not limited to the above examples, and that delay circuits may be used in other applications.

Figure 1:
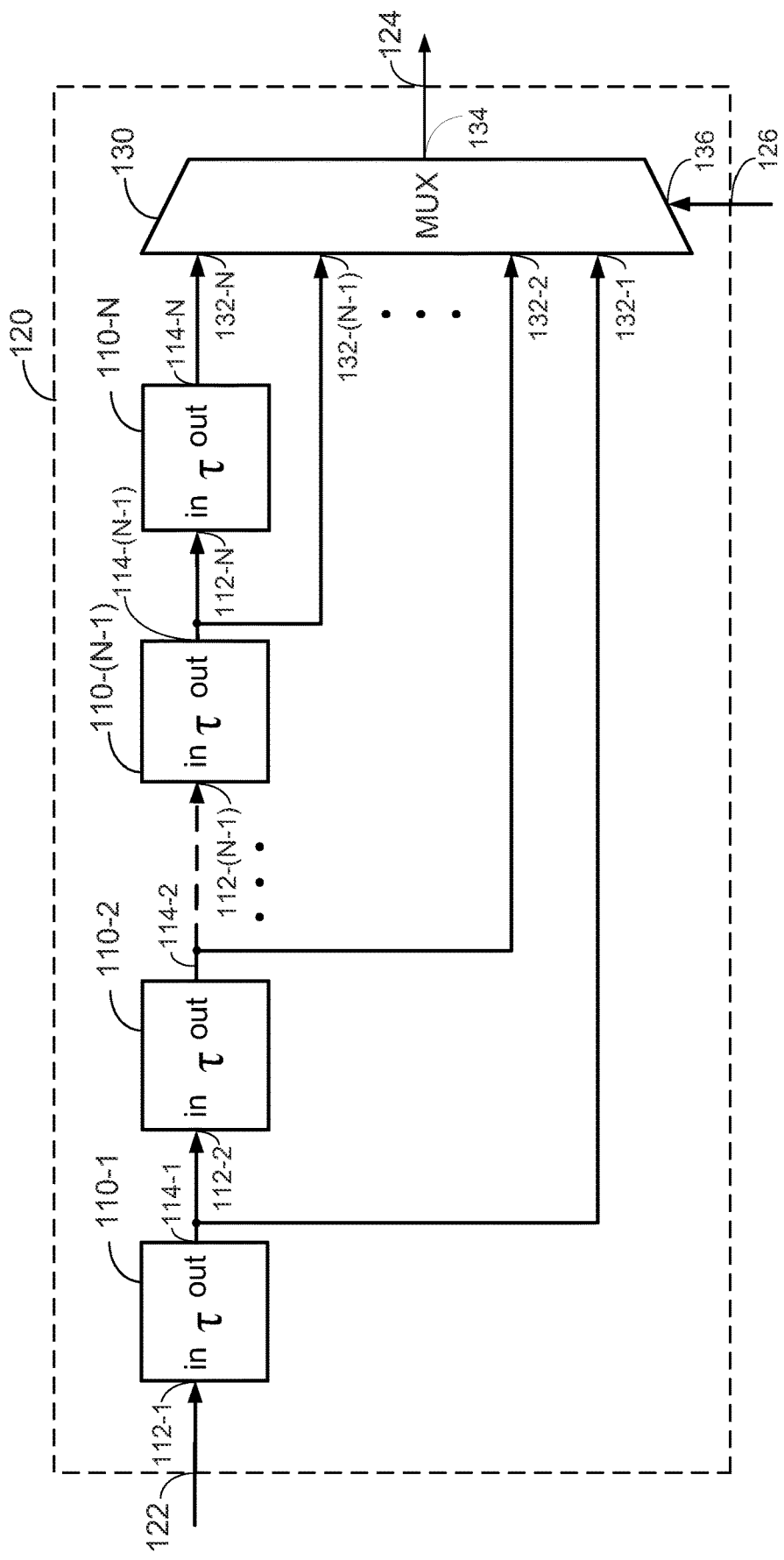
FIG. 1 shows an example of a delay circuit according to certain aspects of the present disclosure.

FIG. 1 shows an example of a delay circuit 120 with an adjustable delay according to certain aspects of the present disclosure. The delay circuit 120 is configured to receive a signal at an input 122, delay the signal by the adjustable delay, and output the delayed signal at an output 124. The signal may be a clock signal, a data signal, or another type of signal. In this example, the delay of the delay circuit 120 is set by a delay control signal (e.g., digital code) received at a control input 126, as discussed further below. The adjustable delay may also be referred to as a tunable delay, a programmable delay, a variable delay, or another term.

In this example, the delay circuit 120 includes multiple delay devices 110-1 to 110-N coupled in series to form a delay line (e.g., delay chain). Each of the delay devices 110-1 to 110-N has a respective input 112-1 to 112-N (labeled "in") and a respective output 114-1 to 114-N (labeled "out"). Each of the delay devices 110-1 to 110-N may have approximately the same delay of τ. The input 112-1 of delay device 110-1 is coupled to the input 122 of the delay circuit 120. The output 114-1 to 114-(N−1) of each of delay devices 110-1 to 110-(N−1) is coupled to the input 112-2 to 112-N of the next delay device 110-2 to 110-N in the delay line. Each of the delay devices 110-1 to 110-N may also be referred to as a delay stage, a delay element, a delay unit, a delay buffer, or another term.

The delay circuit 120 also includes a multiplexer 130 having multiple inputs 132-1 to 132-N, an output 134, and a select input 136. Each of the inputs 132-1 to 132-N of the multiplexer 130 is coupled to the output 114-1 to 114-N of a respective one of the delay devices 110-1 to 110-N in the delay line. As a result, each of the inputs 132-1 to 132-N is coupled to a different point on the delay line corresponding to a different delay. The output 134 of the multiplexer 130 is coupled to the output 124 of the delay circuit 120, and the select input 136 of the multiplexer 130 is coupled to the control input 126 of the delay circuit 120.

The multiplexer 130 is configured to receive the delay control signal at the select input 136 and select one of the inputs 132-1 to 132-N of the multiplexer 130 based on the received delay control signal, in which the selected one of the inputs 132-1 to 132-N is coupled to the output 134 of the multiplexer 130. Because each of the inputs 132-1 to 132-N is coupled to a different point on the delay line corresponding to a different delay, the delay control signal can control the delay of the delay circuit 120 by controlling which one of the inputs 132-1 to 132-N is selected by the multiplexer 130. In this example, the delay circuit 120 allows the delay between the input 122 and the output 124 to be adjusted with a delay step of τ, where τ is the delay of one delay device.

Figure 2:
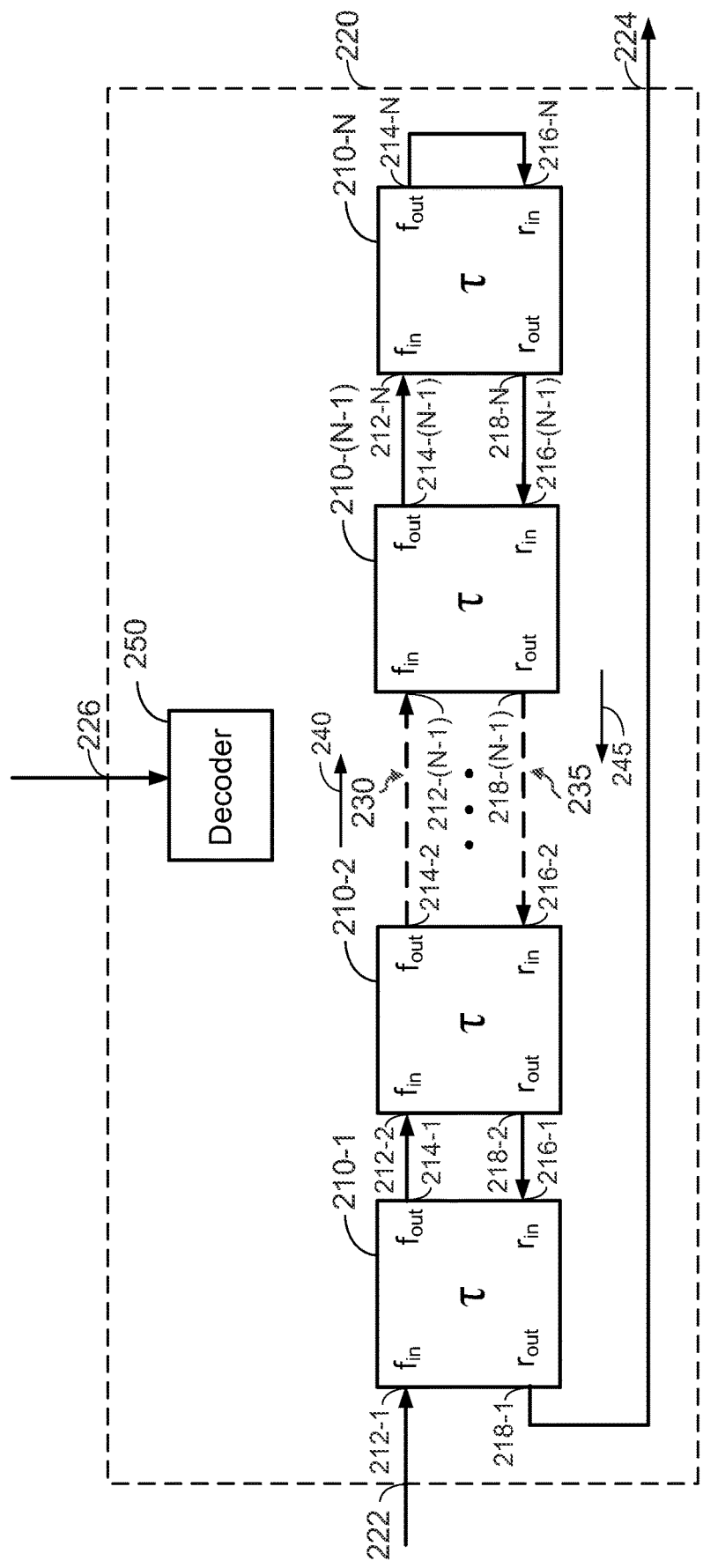
FIG. 2 shows another example of a delay circuit according to certain aspects of the present disclosure.

FIG. 2 shows another example of a delay circuit 220 with an adjustable delay according to certain aspects of the present disclosure. The delay circuit 220 is configured to receive a signal at an input 222, delay the signal by the adjustable delay, and output the delayed signal at an output 224. The signal may be a clock signal, a data signal, or another type of signal. In this example, the delay of the delay circuit 220 is set by a delay control signal (e.g., digital code) received at a control input 226, as discussed further below.

In this example, the delay circuit 220 includes multiple delay devices 210-1 to 210-N arranged in a trombone configuration. Each of the delay devices 210-1 to 210-N has a respective first input 212-1 to 212-N (labeled "fin"), a respective first output 214-1 to 214-N (labeled "$f_{out}$"), a respective second input 216-1 to 216-N (labeled "$r_{in}$"), and a respective second output 218-1 to 218-N (labeled "$r_{out}$").

In this example, the delay devices 210-1 to 210-N are coupled along a forward path 230 using the first inputs 212-1 to 212-N and the first outputs 214-1 to 214-N of the delay devices 210-1 to 210-N. The signal being delayed is received at the input 222 of the delay circuit 220 and propagates along the forward path 230 in the direction 240 (i.e., left to right in FIG. 2). In this example, the first input 212-1 of delay device 210-1 is coupled to the input 222 of the delay circuit 220. The first output 214-1 to 214-(N−1) of each of delay devices 210-1 to 210-(N−1) is coupled to the first input 212-2 to 212-N of the next delay device 210-2 to 210-N in the forward direction 240, as shown in FIG. 2. In this example, the first output 214-N of delay device 210-N may be coupled to the second input 216-N of delay device 210-N.

The delay devices 210-1 to 210-N are also coupled along a return path 235 using the second inputs 216-1 to 216-N and the second outputs 218-1 to 218-N of the delay devices 210-1 to 210-N. The signal being delayed propagates along the return path 235 in the direction 245 (i.e., right to left in FIG. 2), and is output at the output 224 of the delay circuit 220. In this example, the second output 218-2 to 218-N of each of delay devices 210-2 to 210-N is coupled to the second input 216-1 to 216-(N−1) of the next delay device 210-1 to 210-(N−1) in the return direction 245, as shown in FIG. 2. The second output 218-1 of delay device 210-1 is coupled to the output 224 of the delay circuit 220.

In this example, each of the delay devices 210-1 to 210-N may be selectively configured to operate in a first mode or a second mode. In the first mode, a delay device passes the signal being delayed from the respective first input 212-1 to 212-N to the respective first output 214-1 to 212-N in the forward direction 240 and passes the signal being delayed from the respective second input 216-1 to 216-N to the respective second output 218-1 to 218-N in the return direction 245. In the second mode, a delay device passes the signal being delayed from the respective first input 212-1 to 212-N to the respective second output 218-1 to 218-N. Thus, in the second mode, a delay device routes the signal from the forward path 230 to the return path 235.

In this example, the delay circuit 220 includes a decoder 250 coupled to the control input 226. The decoder 250 is configured to receive the delay control signal via the control input 226, and control the mode of each of the delay devices 210-1 to 210-N based on the delay control signal (e.g., digital code). For ease of illustration, the individual connections between the decoder 250 and the delay devices 210-1 to 210-N are not explicitly shown in FIG. 2.

In this example, the decoder 250 controls the delay of the delay circuit 220 based on the delay control signal (e.g., digital code) by controlling which one of the delay devices 210-1 to 210-N is used to route the signal from the forward path 230 to the return path 235 (i.e., controlling which one of the delay devices 210-1 to 210-N operates in the second mode). In this example, the decoder 250 increases the delay of the delay circuit 220 based on the delay control signal by selecting a delay device farther down the forward path 230 to route the signal from the forward path 230 to the return path 235. This increases the delay of the delay circuit 220 by causing the signal to propagate through a larger number of the delay devices 210-1 to 210-N. In this example, the decoder 250 operates the delay device used to route the signal from the forward path 230 to the return path 235 in the second mode and operates the preceding delay devices in the first mode (i.e., the delay devices located to the left of the delay device operating in the second mode in FIG. 2).

In this example, one delay step $\tau$ of the delay circuit 220 may be equal to the sum of the delay through one delay device in the forward direction 240 and the delay through one delay device in the return direction 245. In this example, the delay circuit 220 allows the delay between the input 222 and the output 224 to be adjusted with a delay step of $\tau$, where $\tau$ is the delay of one delay device. In other words, the smallest unit in which the delay can be adjusted in this example is one delay step of $\tau$.

It is to be appreciated that the present disclosure is not limited to the exemplary delay circuits shown in FIGS. 1 and 2. In general, a delay circuit may include multiple delay devices, in which each of the delay devices has a delay of i and one or more of the delay devices can be selectively placed in a delay path of the delay circuit based on the delay control signal (e.g., using switches, logic gates, and/or one or more multiplexers). In general, the delay of the delay circuit is adjusted with a delay step of $\tau$ by controlling the number of the delay devices in the delay path of the delay circuit based on the delay control signal. The larger the number of the delay devices in the delay path, the longer the delay.

Figure 3:
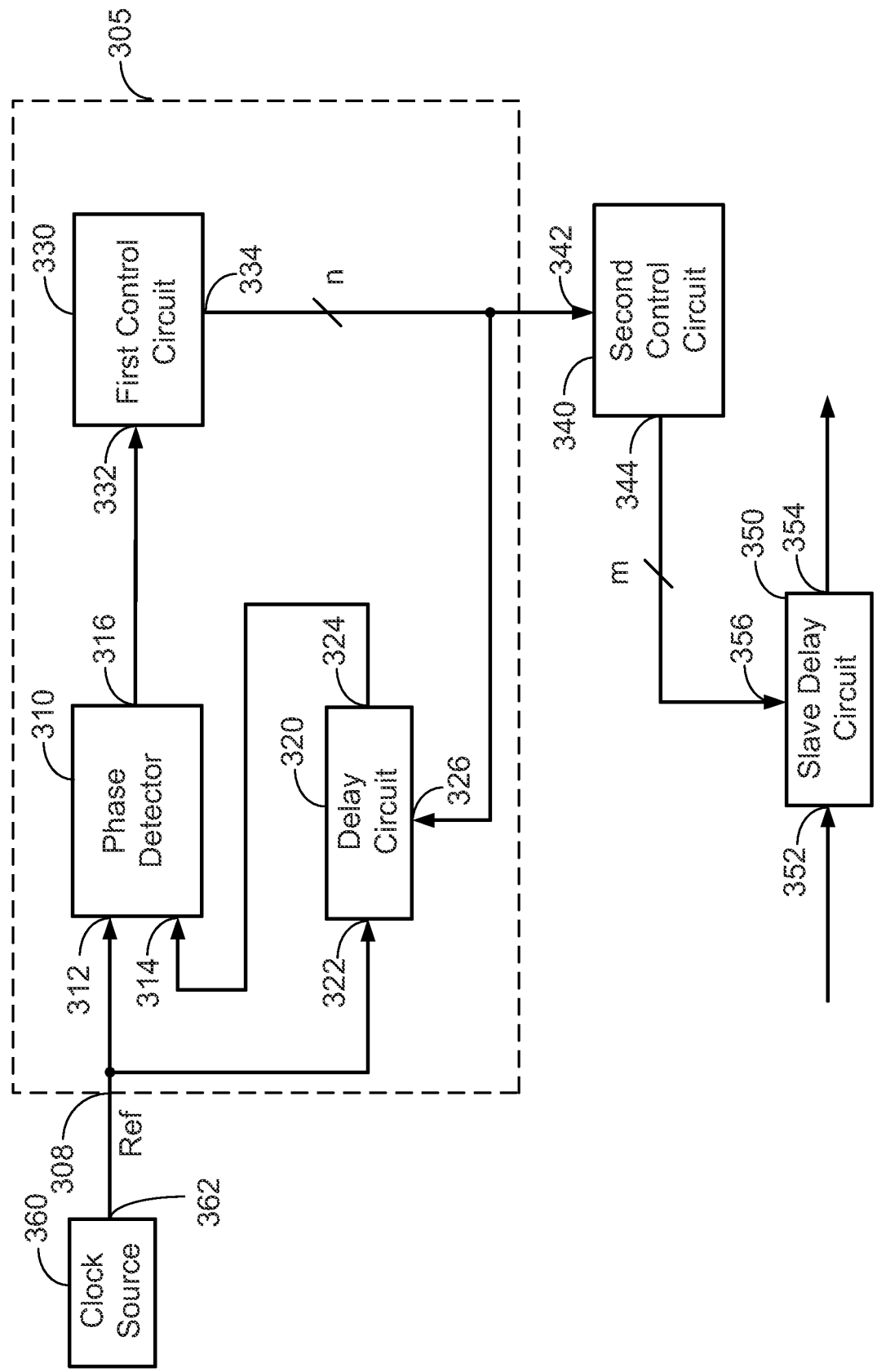
FIG. 3 shows an example of a delay locked loop (DLL) including a delay circuit according to certain aspects of the present disclosure.

In certain aspects, a delay circuit may be used in a delay locked loop (DLL). In this regard, FIG. 3 shows an example of a DLL 305 including a delay circuit 320 with an adjustable delay according to certain aspects of the present disclosure. The DLL 305 has an input 308 configured to receive a reference signal (labeled "Ref"). In one example, the reference signal is a clock signal. The delay circuit 320 has an input 322 and an output 324. In this example, the input 322 of the delay circuit 320 is coupled to the input 308 of the DLL 305. Thus, in this example, the delay circuit 320 receives the reference signal Ref at the input 322, delays the reference signal Ref, and outputs the delayed reference signal at the output 324.

The DLL 305 also includes a phase detector 310, and a first control circuit 330. The phase detector 310 may be implemented with a bang-bang phase detector, a time-to-digital converter (TDC), or another type of phase detector. The phase detector 310 has a first input 312 coupled to the input 308 of the DLL 305, a second input 314 coupled to the output 324 of the delay circuit 320, and an output 316. The phase detector 310 is configured to detect a phase error between the reference signal Ref and the delayed reference signal, and output a phase-error signal indicating the phase error at the output 316. For the example where the phase detector 310 is implemented with a bang-bang phase detector, the phase-error signal may indicate the sign of the phase error between the delayed reference signal and the reference signal Ref (e.g., indicate whether an edge (e.g., rising edge) of the delayed reference signal leads or lags an edge (e.g., rising edge) of the reference signal Ref). For example, the phase-error signal may have a first value (e.g., 1) to indicate the delayed reference signal leads the reference signal Ref and a second value (e.g., −1) to indicate the delayed reference signal lags the reference signal Ref.

The first control circuit 330 has an input 322 coupled to the output 316 of the phase detector 310, and an output 334 coupled to a control input 326 of the delay circuit 320. As discussed above, the first control circuit 330 receives the phase-error signal from the phase detector 310, generates a first delay control signal based on the phase-error signal, and outputs the first delay control signal to the control input 326 of the delay circuit 320.

The delay circuit 320 includes multiple selectable delay devices (not shown in FIG. 3), where each of the delay devices has a delay of $\tau$. In this example, the delay circuit 320 allows the first control circuit 330 to adjust (i.e., tune) the delay of the delay circuit 320 with a delay step of $\tau$ by controlling the number of the delay devices in the delay path of the delay circuit 320 using the first delay control signal. The delay circuit 320 may be implemented with the exemplary delay circuit 120 shown in FIG. 1, or the exemplary delay circuit 220 shown in FIG. 2. However, it is to be appreciated that the delay circuit 320 is not limited to these examples. In one example, the first delay control signal includes a digital code indicating a number n of delay steps $\tau$. In this example, the delay circuit 320 places n delay devices in the delay path of the delay circuit 320 based on the first delay control signal resulting in a delay approximately equal to n·$\tau$. However, it is to be appreciated that the first delay control signal is not limited to this example.

In operation, the first control circuit 330 adjusts the delay of the delay circuit 320 based on the phase-error signal from the phase detector 310 in a direction that reduces the phase error between the delayed reference signal and the reference signal Ref. More particularly, the first control circuit 330 increases the delay of the delay circuit 320 if the edge of the delayed reference signal leads the edge of the reference signal Ref, and decreases the delay of the delay circuit 320 if the edge of the delayed reference signal lags the edge of the reference signal Ref.

For the example where the phase detector 310 is implemented with a bang-bang phase detector, the first control circuit 330 may increment the first delay control signal (e.g., digital code) when the phase-error signal has the first value (e.g., 1) and decrement the first delay control signal when the phase-error signal has the second value (e.g., −1). In this example, the phase detector 310 may output the phase-error signal for each period (e.g., cycle) of the reference signal Ref, in which case the first delay control signal may be updated once per period of the reference signal Ref.

When the DLL 305 locks, the edge of the delayed reference signal is approximately aligned with the edge of the reference signal Ref. This occurs when the delay of the delay circuit 320 is approximately equal to one period (i.e., cycle) of the reference signal Ref. Thus, when the DLL 305 locks, the delay of the delay circuit 320 is approximately equal to one period (i.e., cycle) of the reference signal Ref, and the first delay control signal from the first control circuit 330 indicates the number of delay steps τ in one period (i.e., cycle) of the reference signal Ref.

In certain aspects, the reference signal Ref is a timing signal. In one example, the reference signal Ref may be a clock signal provided by a clock source 360 having an output 362 coupled to the input 308 of the DLL 305, as shown in the example in FIG. 3. In these aspects, the clock source 360 is configured to generate the reference signal Ref, and output the reference signal Ref at the output 362. In one example, the clock source 360 is configured to generate the reference signal Ref at a known frequency that is approximately independent of supply voltage and/or temperature. In this example, the clock source 360 may be implemented with a crystal oscillator or another type of clock source having a known frequency. Because the frequency of the reference signal Ref is known, the period of the reference signal Ref is also known.

Since the period of the reference signal Ref is known, the delay of one delay step τ can be determined by dividing one period of the reference signal Ref by the number of delay steps τ in one period of the reference signal Ref, which is given by the first delay control signal when the DLL 305 is locked. This information can be used to determine the number of delay steps τ needed to achieve a desired delay, as discussed further below.

In this regard, FIG. 3 shows an example of a slave delay circuit 350 and a second control circuit 340, in which the second control circuit 340 uses the number of delay steps τ in one reference period (i.e., one period of the reference signal Ref) from the first control circuit 330 to determine the number of delay steps needed in the slave delay circuit 350 to achieve a desired delay for the slave delay circuit 350. The slave delay circuit 350 is configured to receive a signal at an input 352, delay the signal by an adjustable delay, and output the delayed signal at an output 354. The signal may be a data signal, a clock signal, or another type of signal.

The second control circuit 340 has an input 342 coupled to the output 334 of the first control circuit 330, and an output 344 coupled to a control input 356 of the slave delay circuit 350. In operation, the second control circuit 340 receives the number of delay steps τ in one reference period from the first control circuit 330, and determines the number of delay steps needed to achieve the desired delay for the slave delay circuit 350 based on the number of delay steps τ in one reference period. For example, the second control circuit 340 may determine the number of delay steps needed to achieve the desired delay by multiplying the number of delay steps τ in one reference period by the ratio $T_{DLY}/T_{REF}$, where $T_{DLY}$ is the desired delay and $T_{REF}$ is one reference period. The second control circuit 340 may then output a second delay control signal indicating the determined number m of delay steps τ needed to achieve the desired delay to the control input 356 of the slave delay circuit 350.

The slave delay circuit 350 includes multiple selectable delay devices (not shown in FIG. 3), where each of the delay devices has a delay of one delay step τ. In this example, the slave delay circuit 350 allows the second control circuit 340 to adjust (i.e., tune) the delay of the slave delay circuit 350 with a delay step of τ by controlling the number of the delay devices in the delay path of the slave delay circuit 350 using the second delay control signal. The slave delay circuit 350 may be implemented with the exemplary delay circuit 120 shown in FIG. 1, or the exemplary delay circuit 220 shown in FIG. 2. However, it is to be appreciated that the slave delay circuit 350 is not limited to these examples. In one example, the second delay control signal includes a digital code indicating the number m of delay steps τ in the desired delay for the slave delay circuit 350. In this example, the slave delay circuit 350 places m delay devices in the delay path of the slave delay circuit 350 based on the second delay control signal to achieve the desired delay.

A challenge with the DLL 305 shown in FIG. 3 is that one reference period may be much larger than one delay step τ, which requires that the delay circuit 320 have a very large number of delay devices in order to produce a delay of one reference period. The very large number of delay devices increases the area and cost of the DLL 305. Accordingly, it is desirable to reduce the number of delay devices in an DLL while still providing a delay equal to one reference period.

Figure 4:
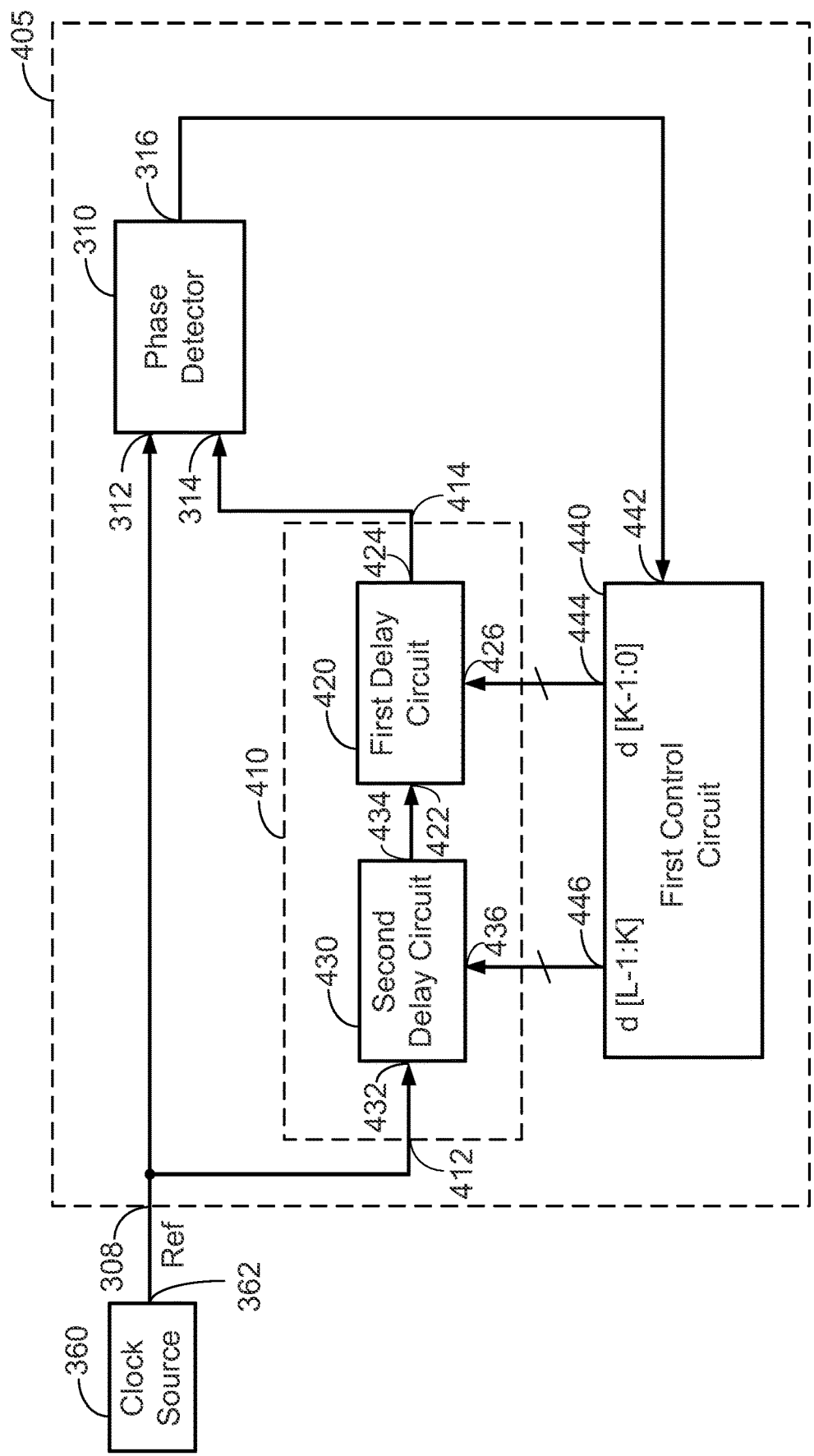
FIG. 4 shows an example of a DLL including a segmented delay circuit according to certain aspects of the present disclosure.

FIG. 4 shows an exemplary DLL 405 including a segmented delay circuit 410 according to certain aspects of the present disclosure. The DLL 405 also includes a first control circuit 440 and the phase detector 310 discussed above. The segmented delay circuit 410 has an input 412 coupled to the input 308 of the DLL 405, and an output 414 coupled to the second input 314 of the phase detector 310. The segmented delay circuit 410 is configured to receive the reference signal Ref at the input 412, delay the reference signal Ref by an adjustable delay, and output the delayed reference signal at the output 414.

The segmented delay circuit 410 includes a first delay circuit 420 and a second delay circuit 430 coupled in series between the input 412 and the output 414 of the segmented delay circuit 410. Thus, the delay of the segmented delay circuit 410 is the sum of the delay of the first delay circuit 420 and the delay of the second delay circuit 430. In this example, the first delay circuit 420 has an input 422 and an output 424, in which the first delay circuit 420 is configured to delay the reference signal between the input 422 and the output 424 with a delay step of τ. The second delay circuit 430 has an input 432 and an output 434, in which the second delay circuit 430 is configured to delay the reference signal Ref between the input 432 and the output 434 with a coarse delay step of $τ_c$, where one coarse delay step $τ_c$ is a multiple of one delay step τ. In other words, $τ_c = c·τ$, where c is a multiple. In certain aspects, the multiple c is a power of two. This feature allows the first delay control signal from the first control circuit 440 to be split between the first delay circuit 420 and the second delay circuit 430, as discussed further below. The delay step τ may also be referred to as a first delay step and the coarse delay step $τ_c$ may also be referred to as a second delay step, where the second delay step is a multiple of the first delay step (i.e., c·τ).

In the example in FIG. 4, the input 432 of the second delay circuit 430 is coupled to the input 412 of the segmented delay circuit 410, the input 422 of the first delay circuit 420 is coupled to the output 434 of the second delay circuit 430, and the output 424 of the first delay circuit 420 is coupled to the output 414 of the segmented delay circuit 410. Thus, in this example, the reference signal is delayed by the second delay circuit 430 and then delayed by the first delay circuit 420. However, it is to be appreciated that, in other implementations, the order of the first delay circuit 420 and the second delay circuit 430 in the segmented delay circuit 410 may be switched.

The first control circuit 440 has an input 422 coupled to the output 316 of the phase detector 310, a first output 444 coupled to a control input 426 of the first delay circuit 420, and a second output 446 coupled to a control input 436 of the second delay circuit 430. The first control circuit 440 receives the phase-error signal from the phase detector 310, generates the first delay control signal based on the phase-error signal, and splits the first delay control signal between the control inputs 426 and 436 of the first and second delay circuits 420 and 430.

In certain aspects, the first delay control signal includes a digital code d [L−1:0] indicating a number of delay steps τ. For the example where the phase detector 310 is implemented with the bang-bang phase detector, the first control circuit 440 may increment the first delay control signal when the phase-error signal has the first value (e.g., 1) and decrement the first delay control signal when the phase-error signal has the second value (e.g., −1). In this example, the phase detector 310 may output the phase-error signal for each period (e.g., cycle) of the reference signal Ref, in which case the first delay control signal may be updated once per period of the reference signal Ref.

The first delay control signal is split between the first output 444 and the second output 446 of the first control circuit 440, in which a first portion of the first delay control signal is output at the first output 444, and a second portion of the first delay control signal is output at the second output 446. Thus, in this example, the control input 426 of the first delay circuit 420 receives the first portion of the first delay control signal and the control input 436 of the second delay circuit 430 receives the second portion of the first delay control signal.

For the example in which the first delay control signal includes the digital code d [L−1:0] indicating a number of delay steps τ, the first portion of the first delay control signal includes a first portion of the digital code d [K−1:0] and the second portion of the first delay control signal includes a second portion of the digital code d[L−1:K]. The first portion of the digital code d [K−1:0] includes lower-order bits of the digital code relative to the second portion of the digital code d [L−1:K]. In other words, the second portion of the digital code d [L−1:K] includes high-order bits of the digital code relative to the first portion of the digital code d [K−1:0]. The lower-order bits have lower value than the higher-order bits in the digital code d [L−1:0]. The lowest-order bit (i.e., d[0]) may also be referred to as the least significant bit (LSB) and the highest-order bit (i.e., d [L−1]) may also be referred to as the most significant bit (MSB).

In this example, the first portion of the digital code d [K−1:0] includes first bits indicating a number of delay steps τ (e.g., a number of delay steps τ within one coarse delay step τ0. The second portion of the digital code d [L−1:K] includes second bits indicating a number of coarse delay steps $\tau_c$, assuming that the multiple c discussed above is a power of two (e.g., $c=2^K$). Making the multiple c a power of two allows the delay control bits (i.e., d [L−1:K]) for the second delay circuit 430 to be concatenated with the delay control bits (i.e., d [K−1:0]) for the first delay circuit 420 to form the digital code d[L−1:0] for the first delay control signal.

The first delay circuit 420 is configured to delay the reference signal with a delay step of τ based on the first portion of the first delay control signal. For the example where the first portion of the first delay control signal includes the first portion of the digital code d [K−1:0], the first delay circuit 420 may be configured to delay the reference signal by p·τ, where p is the number of delay steps τ indicated by the first portion of the digital code d [K−1:0].

The second delay circuit 430 is configured to delay the reference signal with a coarse delay step of $\tau_c$ based on the second portion of the first delay control signal. As discussed above, one coarse delay step $\tau_c$ is equal to c·τ, where c is a multiple. For the example where the second portion of the first delay control signal includes the second portion of the digital code d [L−1:K], the second delay circuit 430 may be configured to delay the reference signal by q·$\tau_c$, where q is the number of coarse delay steps $\tau_c$ indicated by the second portion of the digital code d [L−1:K].

When the DLL 405 locks, the delay of the segmented delay circuit 410 is approximately equal to one reference period (i.e., one period of the reference signal Ref), and the first delay control signal (e.g., digital code d [L−1:0]) indicates the number of delay steps τ in one reference period. The first delay control signal may be sent to the second control circuit 340 (shown in FIG. 3). The second control circuit 340 may then use the number of delay steps τ in one reference period to determine the number of delay steps τ needed to achieve the desired delay for the slave delay circuit 350 (shown in FIG. 3). The second control circuit 340 may then generate the second delay control signal indicating the number of delay steps τ needed to achieve the desired delay and output the second delay control signal to the slave delay circuit 350, as discussed above.

In certain aspects, the first delay circuit 420 includes multiple selectable delay devices (not shown in FIG. 4), where each of the delay devices has a delay of τ. In these aspects, the first delay circuit 420 is configured to adjust (i.e., tune) the delay of the first delay circuit 420 based on the first portion of the first delay control signal by controlling the number of the delay devices in the delay path of the first delay circuit 420 based on the first portion of the first delay control signal. For the example where the first portion of the first delay control signal includes the first portion of the digital code d [K−1:0], the first delay circuit 420 may place p of the delay devices in the delay path of the first delay circuit 420, where p is the number of delay steps τ indicated by the first portion of the digital code d [K−1:0].

For the example where the first delay circuit 420 is implemented with the exemplary delay circuit 120 shown in FIG. 1, the multiplexer 130 may select the input 132-1 to 132-N corresponding to a delay of approximately p·τ based on the first portion of the digital code d [K−1:0]. For the example where the first delay circuit 420 is implemented with the exemplary delay circuit 220 shown in FIG. 2, the decoder 250 may operate the delay devices 210-1 to 210-N to produce a delay of approximately p·τ based on the first portion of the digital code d [K−1:0]. However, it is to be appreciated that the first delay circuit 420 is not limited to these examples.

In certain aspects, the second delay circuit 430 may be implemented using one or more ring oscillators. In these aspects, each ring oscillator includes delay devices coupled in a loop where one period of the ring oscillator is approximately equal to one coarse delay step $\tau_c$.

Figure 5:
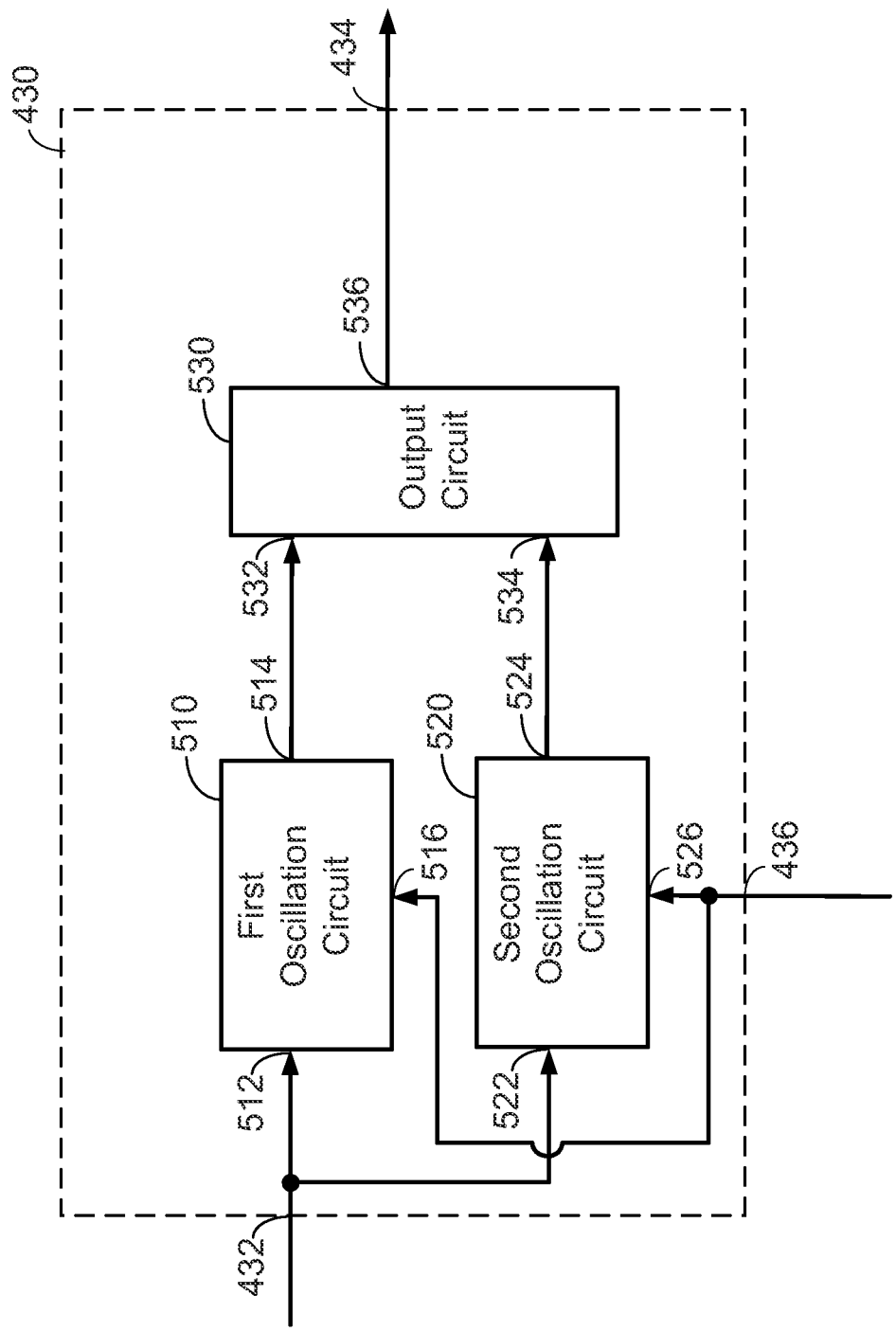
FIG. 5 shows an exemplary implementation of a coarse delay circuit according to certain aspects of the present disclosure.

In this regard, FIG. 5 shows an exemplary implementation of the second delay circuit 430 using ring oscillators according to certain aspects. In this example, the second delay circuit 430 includes a first oscillation circuit 510, a second oscillation circuit 520, and an output circuit 530.

The first oscillation circuit 510 has an input 512, an output 514, and a count input 516. The input 512 is coupled to the input 432 of the second delay circuit 430, and the count input 516 is coupled to the control input 436 of the second delay circuit 430. The first oscillation circuit 510 includes a first ring oscillator (not shown in FIG. 5) having a period equal to one coarse delay step $\tau_c$. In operation, the first oscillation circuit 510 is configured to detect a rising edge of the reference signal Ref at the input 432, count periods of the first ring oscillator in response to the detected rising edge, and output a first delay signal at the output 514 after q periods of the first ring oscillator have been counted. Thus, in this example, the first delay signal is delayed from the rising edge at the input 432 by a delay of $q \cdot \tau_c$. In this example, the number of periods q that are counted is indicated by the second portion of the first delay control signal (e.g., the second portion of the digital code d [L−1:K]).

The second oscillation circuit 520 has an input 522, an output 524, and a count input 526.

The input 522 is coupled to the input 432 of the second delay circuit 430, and the count input 526 is coupled to the control input 436 of the second delay circuit 430. The second oscillation circuit 520 includes a second ring oscillator (not shown in FIG. 5) having a period equal to one coarse delay step $\tau_c$. In operation, the second oscillation circuit 520 is configured to detect a falling edge of the reference signal Ref at the input 432, count periods of the second ring oscillator in response to the detected falling edge, and output a second delay signal at the output 524 after q periods of the second ring oscillator have been counted. Thus, in this example, the second delay signal is delayed from the falling edge at the input 432 by a delay of $q \cdot \tau_c$. In this example, the number of periods q that are counted is indicated by the second portion of the first delay control signal (e.g., the second portion of the digital code d [L−1:K]).

The output circuit 530 has a first input 532, a second input 534, and an output 536. The first input 532 is coupled to the output 514 of the first oscillation circuit 510, the second input 534 is coupled to the output 524 of the second oscillation circuit 520, and the output 536 of the output circuit 530 is coupled to the output 434 of the second delay circuit 430. In operation, the output circuit 530 is configured to toggle the output 536 from zero to one in response to the first delay signal from the first oscillation circuit 510. Thus, in this example, the output circuit 530 outputs a rising edge in response to the first delay signal, which is delayed from the rising edge at the input 432 by a delay of $q \cdot \tau_c$. The output circuit 530 is configured to toggle the output 536 from one to zero in response to the second delay signal from the second oscillation circuit 520. Thus, in this example, the output circuit 530 outputs a falling edge in response to the second delay signal, which is delayed from the falling edge at the input 432 by a delay of $q \cdot \tau_c$. Thus, the output 536 outputs a delayed version of the reference signal Ref that is delayed from the reference signal Ref at the input 432 by a delay of approximately $q \cdot \tau_c$.

Figure 6:
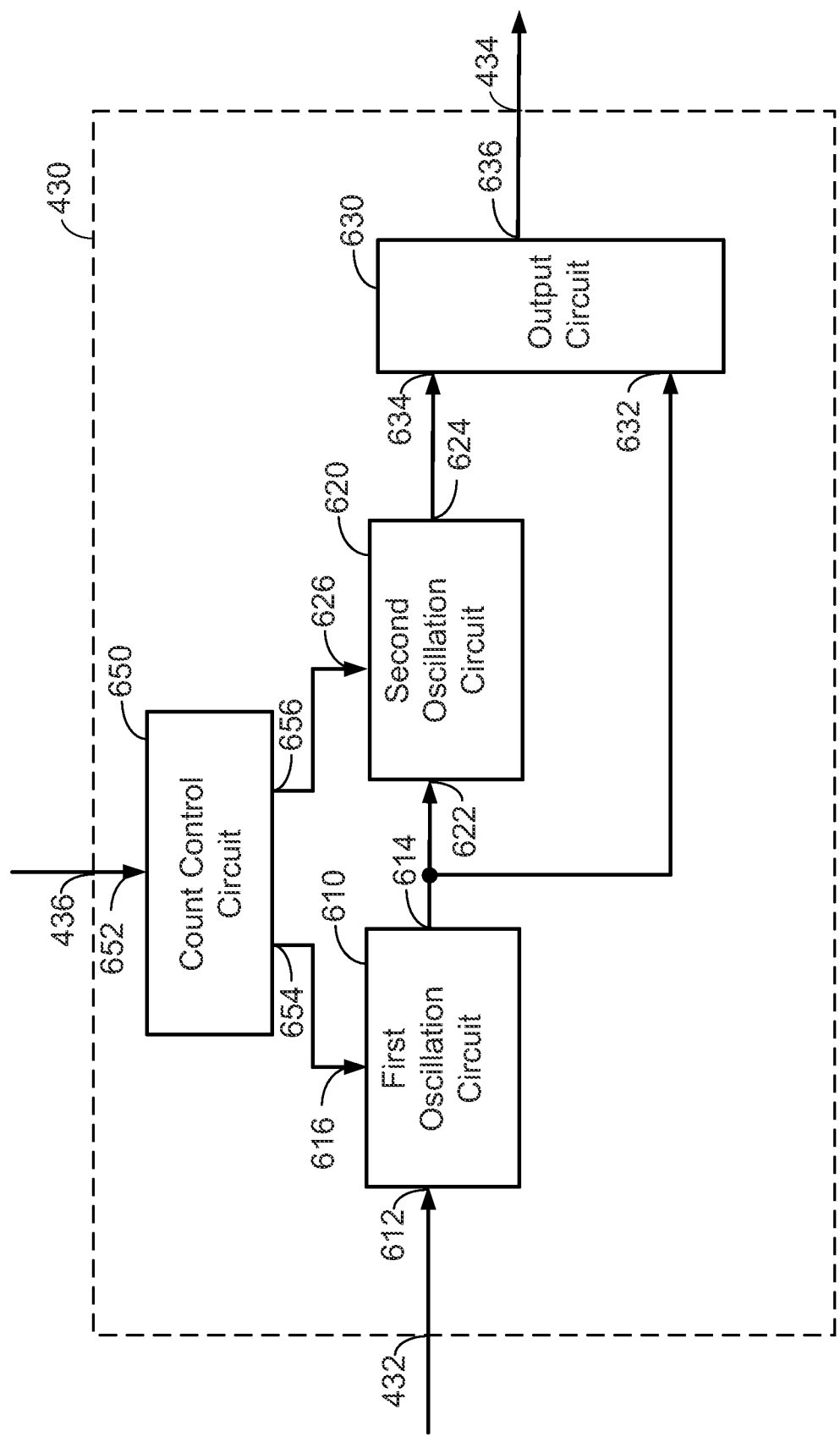
FIG. 6 shows another exemplary implementation of a coarse delay circuit according to certain aspects of the present disclosure.

It is to be appreciated that the second delay circuit 430 is not limited to the example shown in FIG. 5. In this regard, FIG. 6 shows another example in which the second delay circuit 430 is implemented with two ring oscillators in cascade, as discussed further below. In this example, the second delay circuit 430 includes a first oscillation circuit 610, a second oscillation circuit 620, a count control circuit 650, and an output circuit 630.

The count control circuit 650 has an input 652 coupled to the control input 436 of the second delay circuit 430, a first output 654, and a second output 656. The count control circuit 650 is configured to receive the second portion of the first delay control signal (e.g., the second portion of the digital code d [L−1:K]), which indicates a number q of coarse delay steps $\tau_c$. The count control circuit 650 is configured to generate a first count value equal to $\lfloor q/2 \rfloor$, which is q/2 rounded to the nearest lowest integer (i.e., the floor of q/2). The control circuit 650 is also configured to generate a second count value equal to $q - \lfloor q/2 \rfloor$. For the case where q is even, both the first count value and the second count value are equal to q/2. The count control circuit 650 outputs the first count value at the first output 654 and outputs the second count value at the second output 656.

The first oscillation circuit 610 has an input 612, an output 614, and a count input 616. The input 612 is coupled to the input 432 of the second delay circuit 430, and the count input 616 is coupled to the first output 654 of the count control circuit 650. The first oscillation circuit 610 includes a first ring oscillator (not shown in FIG. 6) having a period equal to one coarse delay step $\tau_c$. In operation, the first oscillation circuit 610 is configured to detect a rising edge of the reference signal Ref at the input 432, count periods of the first ring oscillator in response to the detected rising edge, and output a first delay signal at the output 614 after counting a number of periods of the first ring oscillator equal to the first count value.

The second oscillation circuit 620 has an input 622, an output 624, and a count input 626. The input 622 is coupled to the output 614 of the first oscillation circuit 610, and the count input 626 is coupled to the second output 656 of the count control circuit 650. The second oscillation circuit 620 includes a second ring oscillator (not shown in FIG. 6) having a period equal to one coarse delay step $\tau_c$. In operation, the second oscillation circuit 620 is configured to detect the first delay signal from the first oscillation circuit 610, count periods of the second ring oscillator in response to the detected first delay signal, and output a second delay signal at the output 624 after counting a number of periods of the second ring oscillator equal to the second count value.

The output circuit 630 has a first input 632, a second input 634, and an output 636. The first input 632 is coupled to the output 614 of the first oscillation circuit 610, the second input 634 is coupled to the output 624 of the second oscillation circuit 620, and the output 636 of the output circuit 630 is coupled to the output 434 of the second delay circuit 430. In operation, the output circuit 630 is configured to toggle the output 636 from one to zero in response to the first delay signal from the first oscillation circuit 610 and toggle the output 636 from zero to one in response to the second delay signal from the second oscillation circuit 620, or vice versa. For the example where q is even, the output circuit 630 toggles the output 636 from one to zero after a delay of $q/2 \cdot \tau_c$ from the detected rising edge at the input 432 and toggles the output 636 from zero to one after a delay of $q \cdot \tau_c$ from the detected rising edge at the input 432, or vice versa. This results in a delayed version of the reference signal Ref that has a 50% duty cycle and is delayed from the reference signal Ref at the input 432 by a delay of approximately $q \cdot \tau_c$.

Figure 7:
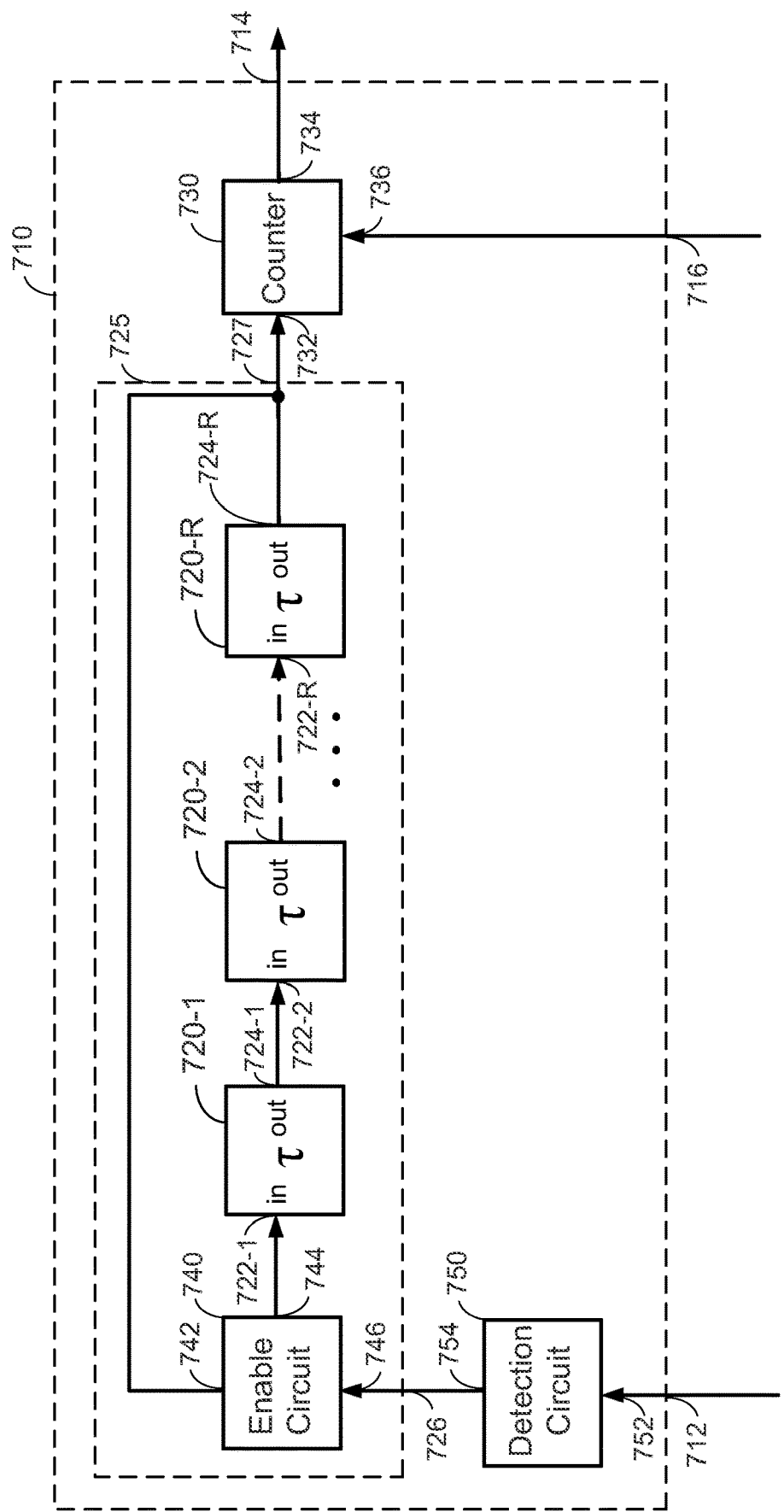
FIG. 7 shows an exemplary implementation of an oscillation circuit according to certain aspects of the present disclosure.

FIG. 7 shows an example of an oscillation circuit 710 according to certain aspects. The oscillation circuit 710 may be used to implement each of the oscillation circuits 510, 520, 610, and 620 discussed above (i.e., each of the oscillations circuits 510, 520, 610, and 620 may be a separate instance of the exemplary oscillation circuit 710 shown in FIG. 7). In this example, the oscillation circuit 710 includes a ring oscillator 725, a detection circuit 750, and a counter 730.

The detection circuit 750 has an input 752 coupled to the input 712 of the oscillation circuit 710, and an output 754. The ring oscillator 725 has an enable input 726 coupled to the output 754 of the detection circuit 750, and an output 727. The counter 730 has an input 732 coupled to the output 727 of the ring oscillator 725, an output 734 coupled to the output 714 of the oscillation circuit 710, and a count input 736 coupled to the count input 716 of the oscillation circuit 710.

In certain aspects, the ring oscillator 725 is configured to oscillate when enabled by the detection circuit 750, in which one period (i.e., cycle) of the ring oscillator 725 is equal to one coarse delay step $\tau_c$. In one example, the detection circuit 750 is configured to detect an edge at the input 752. The edge may be a rising edge or a falling edge of the reference signal Ref or another signal. For the example where the oscillation circuit 710 implements the second oscillation circuit 620, the detection circuit 750 may be configured to detect the first delay signal from the first oscillation circuit 610. In response to detection of the edge or first delay signal, the detection circuit 750 enables the ring oscillator 725, which causes the ring oscillator 725 to oscillate with a period equal to one coarse delay step $\tau_c$.

The counter 730 is configured to count periods (i.e., cycles) of the ring oscillator 725 when the ring oscillator 725 is enabled by the detection circuit 750. In one example, the counter 730 is configured to receive the second portion of the first delay control signal (e.g., the second portion of the digital coded [L−1:K]), and set a count value of the counter 730 based on the number of periods (e.g., q) indicated by the second portion of the first delay control signal. In another example, the counter 730 may receive the first count value or the second count value from the count control circuit 650, and set the count value of the counter 730 to the first count value or the second count value.

In one example, the counter 730 may count down from the count value set above, and output a delay signal when the count reaches zero. Alternatively, the counter 730 may count from zero, and output the delay signal when the count reaches the count value set above. For the example where the oscillation circuit 710 implements the first oscillation circuit 510 or 610, the delay signal corresponds to the first delay signal discussed above. For the example where the oscillation circuit 710 implements the second oscillation circuit 520 or 620, the delay signal corresponds to the second delay signal discussed above. The ring oscillator 730 may be disabled (e.g., by the counter 730) when the delay signal is output by the counter 730.

In the example in FIG. 7, the ring oscillator 725 includes an enable circuit 740 and multiple delay devices 720-1 to 720-R coupled in series to form a delay line (e.g., delay chain). The enable circuit 740 has an input 742, an output 744, and an enable input 746. The enable input 746 is coupled to the output 754 of the detection circuit 750. In certain aspects, the enable circuit 740 is configured to couple the input 742 to the output 744 when enabled by the detection circuit 750, and decouple the input 742 from the output 744 when disabled. For example, the detection circuit 750 may enable the enable circuit 740 when the detection circuit 750 detects the edge or the first delay signal at the input 752 discussed above. The enable circuit 740 may be disabled by the counter 730 (e.g., when the counter 730 outputs the delay signal).

Each of the delay devices 720-1 to 720-R has a respective input 722-1 to 722-R (labeled "in") and a respective output 724-1 to 724-R (labeled "out"). Each of the delay devices 720-1 to 720-R may have approximately the same delay of $\tau$. The input 722-1 of the first delay device 720-1 in the delay line is coupled to the output 744 of the enable circuit 740, and the output 724-R of the last delay device 720-R in the delay line is coupled to the input 742 of the enable circuit 740. When the enable circuit 740 is enabled by the detection circuit 750, the enable circuit 740 couples the input 742 to the output 744 which couples the delay devices 720-1 to 720-R into a loop. In this regard, the enable circuit 740 may be inverting (i.e., invert the signal between the input 742 and the output 744) to cause the loop to oscillate with a period equal to 2R·$\tau$. The number of delay devices 720-1 to 720-R may be chosen such that 2R equals the multiple c discuss above so that one period of the ring oscillator 725 is approximately equal to one coarse delay step $\tau_c$.

Figure 8A:
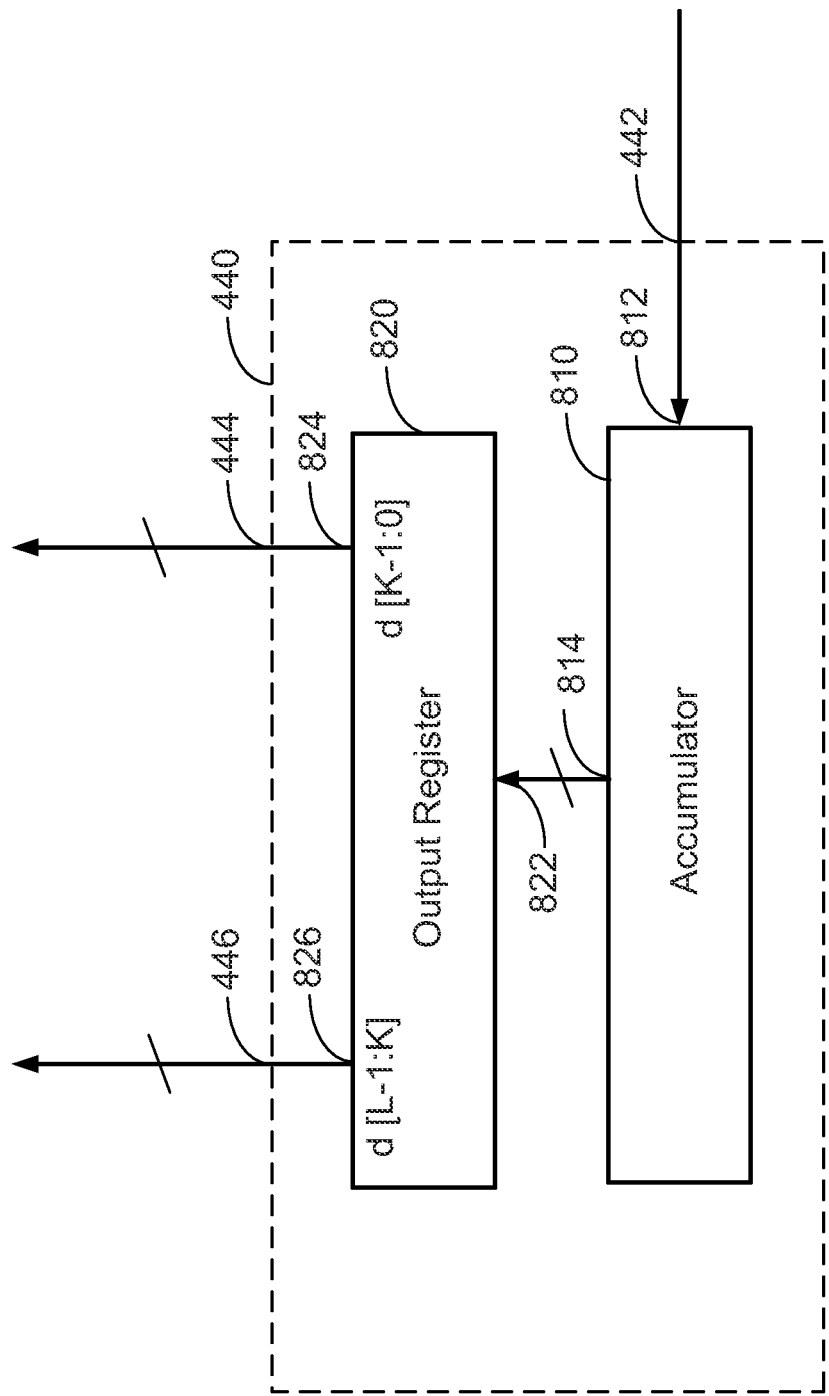
FIG. 8A shows an exemplary implementation of a control circuit according to certain aspects of the present disclosure.

FIG. 8A shows an exemplary implementation of the first control circuit 440 according to certain aspects. In this example, the first control circuit 440 includes an accumulator 810 and an output register 820. The accumulator 810 has an input 812 coupled to the input 442 of the first control circuit 440, and an output 814. The output register 820 has an input 822 coupled to the output 814 of the accumulator 810, a first output 824 coupled to the first output 444 of the first control circuit 440, and a second output 826 coupled to the second output 446 of the first control circuit 440.

The accumulator 810 is configured to receive the phase-error signal from the phase detector 310 at the input 812, and increase or decrease the first delay control signal based on the phase-error signal. For the example where the phase detector 310 is implemented with a bang-bang phase detector, the accumulator 810 may increment the first delay control signal (e.g., digital code d [L−1:0]) when the phase-error signal has the first value (e.g., 1) and decrement the first delay control signal when the phase-error signal has the second value (e.g., −1). The accumulator 810 is configured to output the first delay control signal to the output register 820. The accumulator 810 may also be referred to as an integrator, or another term.

The output register 820 is configured to receive the first delay control signal (e.g., digital coded [L−1:0]) at the input 822, and hold the first delay control signal. The output register 820 outputs the first portion of the first delay control signal (e.g., d [K−1:0]) at the first output 824, and outputs the second portion of the first delay control signal (e.g., d [L−1:K]) at the second output 826.

Figure 8B:
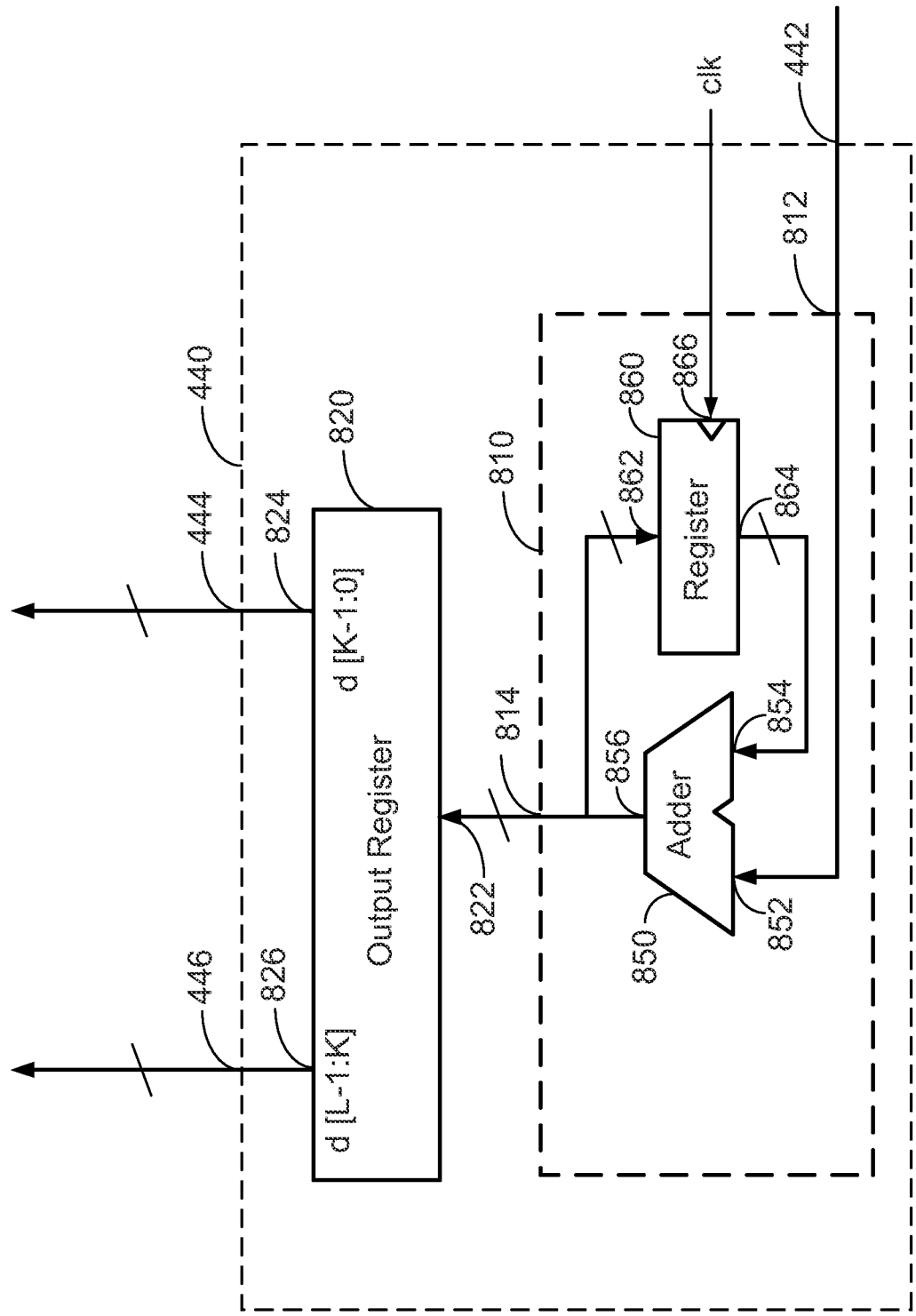
FIG. 8B shows an exemplary implementation of an accumulator according to certain aspects of the present disclosure.

FIG. 8B shows an exemplary implementation of the accumulator 810 according to certain aspects. In this example, the accumulator 810 includes an adder 850 and a register 860. The adder 850 has a first input 852, a second input 854, and an output 856. The first input 852 of the adder 850 is coupled to the input 812 of the accumulator 810, and the output 856 of the adder 850 is coupled to the output 814 of the accumulator 810. The register 860 has an input 862 coupled to the output 856 of the adder 850, and an output 864 coupled to the second input 854 of the adder 850. The register 860 also has a clock input 866 configured to receive a clock signal clk. In one example, the clock signal clk is the reference signal Ref.

In this example, the output 856 of the adder 850 provides the first delay control signal to the output 814 of the accumulator 810. The register 860 is configured to latch the first delay control signal (e.g., digital code d [L−1:0]) on an edge (e.g., rising edge or falling edge) of the clock signal clk, and output the latched first delay control signal to the second input 854 of the adder 850. The adder 850 is configured to add the phase-error signal (e.g., 1 or −1) received at the first input 852 to the latched first delay control signal received at the second input 854 to update the first delay control signal. In this example, the first delay control signal may be a running sum of the phase-error signal. In certain aspects, the register 860 may be implemented with a multibit flip flop that is clocked by the clock signal clk. The multibit flip flop may include multiple one-bit flip flops arranged in parallel.

Figure 8C:
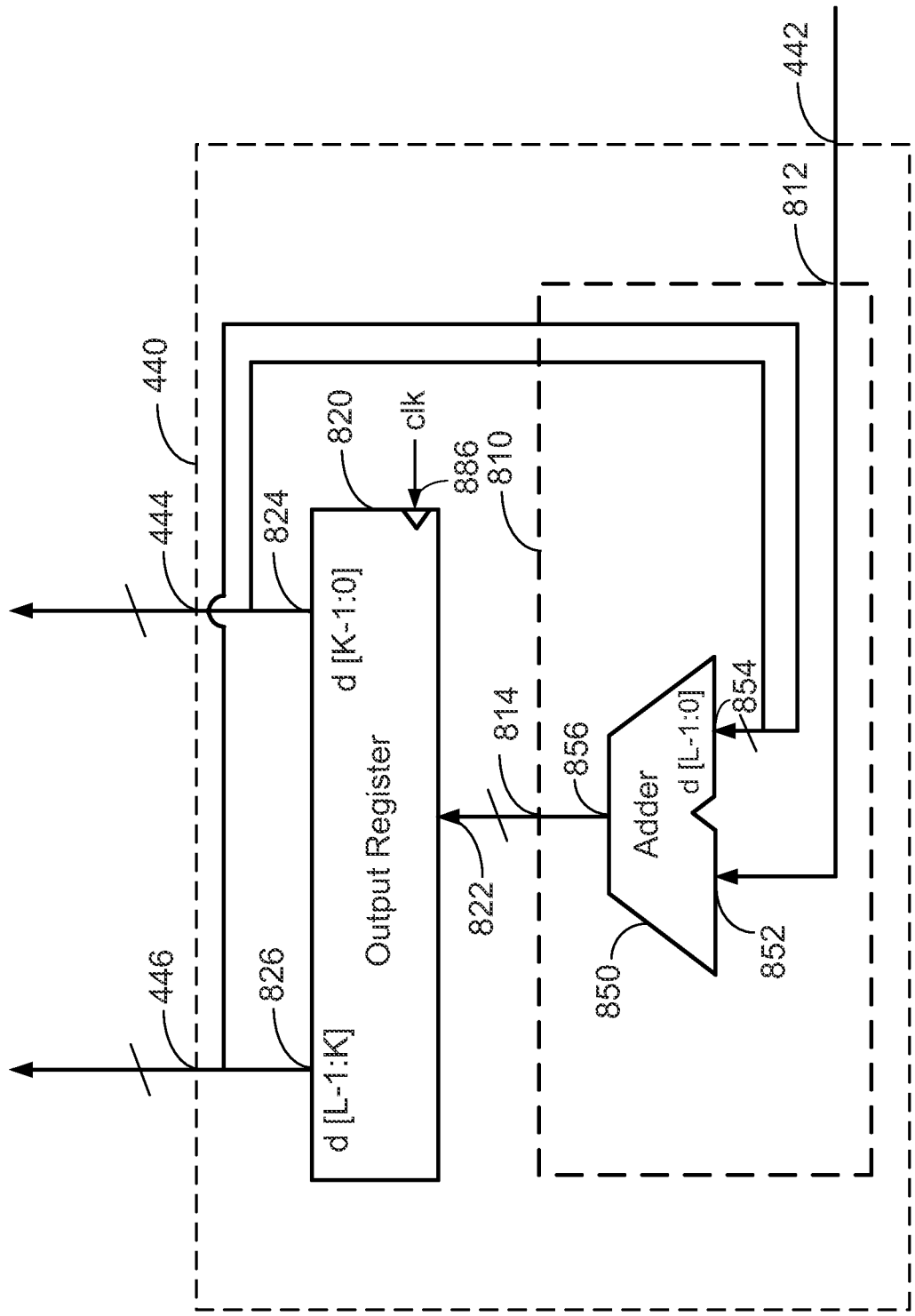
FIG. 8C shows another exemplary implementation of an accumulator according to certain aspects of the present disclosure.

FIG. 8C shows another exemplary implementation in which the output register 820 is also used for accumulation, eliminating the need for the register 860 shown in FIG. 8B. In this example, the first and second outputs 824 and 826 of the output register 820 are coupled to the second input 854 of the adder 850 to provide the second input 854 of the adder 850 with the first delay control signal (e.g., digital coded [L−1:0]). In one example, the output register 820 may include a clock input 888 configured to receive the clock signal clk (e.g., the reference signal Ref). In this example, the output register 820 may be configured to latch the first delay control signal (e.g., digital code d [L−1:0]) on an edge (e.g., rising edge or falling edge) of the clock signal clk, output a first portion of the latched first delay control signal at the first output 824 of the output register 820, and output a second portion of the latched first delay control signal at the second output 826 of the output register 820.

It is to be appreciated that the accumulator 810 is not limited to the exemplary implementations illustrated in FIGS. 8B and 8C, and that the accumulator 810 may be implemented with other circuits.

Figure 9:
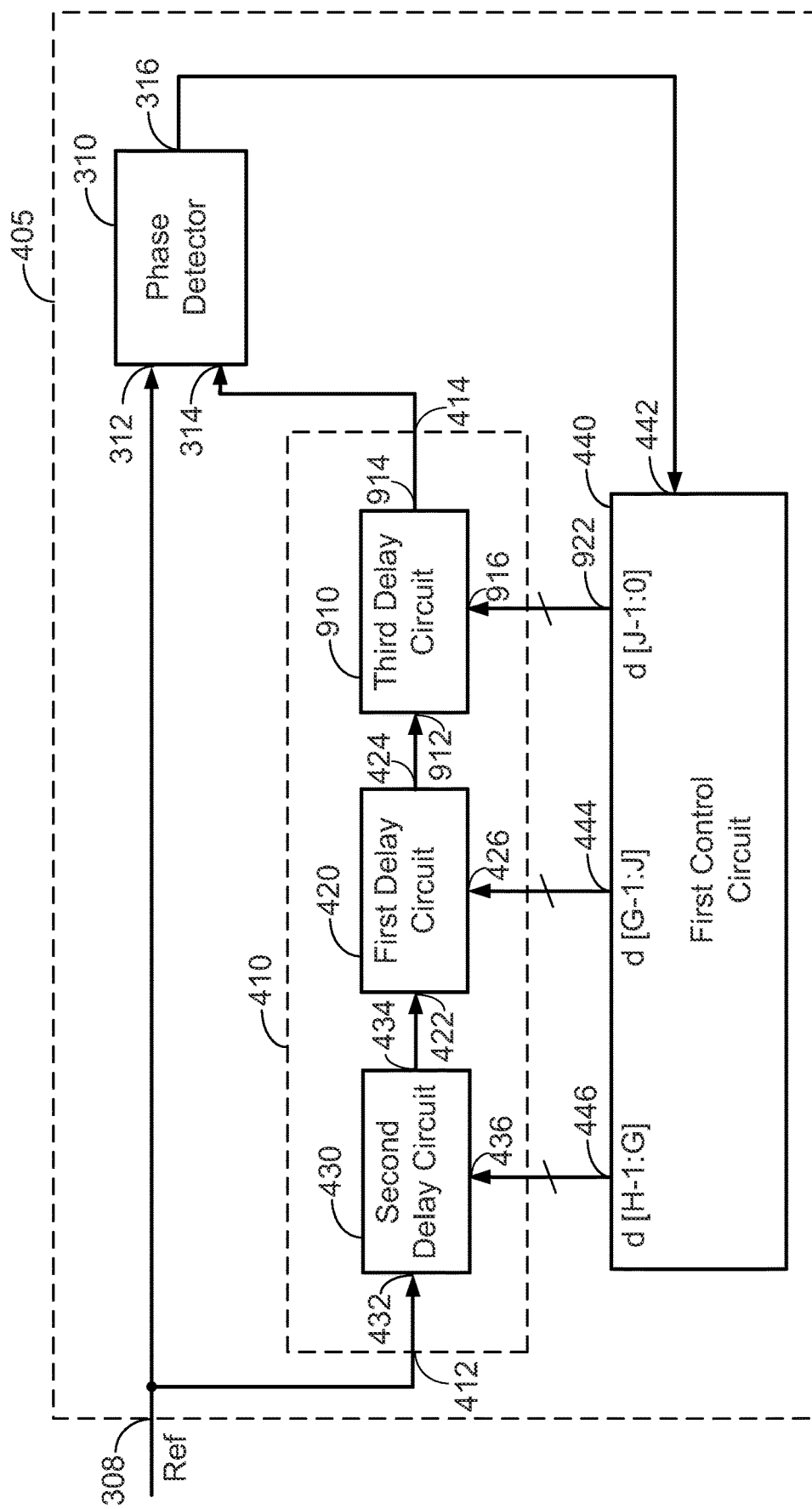
FIG. 9 shows another example of a DLL including a segmented delay circuit according to certain aspects of the present disclosure.

It is to be appreciated that the segmented delay circuit 410 is not limited to first delay circuit 420 and the second delay circuit 430, and may include one or more additional delay circuits. In this regard, FIG. 9 shows an example in which the segmented delay circuit 410 includes a third delay circuit 910 coupled in series with the first delay circuit 420 and the second delay circuit 430. Thus, in this example, the delay of the segmented delay circuit 410 is the sum of the delay of the first delay circuit 420, the delay of the second delay circuit 430, and the delay of the third delay circuit 910.

In this example, the third delay circuit 910 has an input 912 and an output 914, in which the third delay circuit 910 is configured to delay the reference signal between the input 912 and the output 914 with a fine delay step of $\tau_f$, where one fine delay step $\tau_f$ is a fraction of a delay step $\tau$. In one example, $\tau_f = \tau/D$, where D is a divider. In other words, delay step $\tau$ is a multiple of the fine delay step $\tau_f$ (i.e., $\tau = D \cdot \tau_f$ where D is a multiple in this expression). In certain aspects, the divider D is a power of two. This feature allows the first delay control signal from the first control circuit 440 to be split between the first delay circuit 420, the second delay circuit 430, and the third delay circuit 910, as discussed further below. The delay step $\tau$ may also be referred to as a first delay step, the coarse delay step $\tau_c$ may also be referred to as a second delay step, and the fine delay step $\tau_f$ may also be referred to as a third delay step, where the second delay step is a multiple c of the first delay step and the first delay step is a multiple D of the third delay step.

In the example in FIG. 9, the input 912 of the third delay circuit 910 is coupled to the output 424 of the first delay circuit 420, and the output 914 of the third delay circuit 910 is coupled to the output 414 of the segmented delay circuit 410. Thus, in this example, the reference signal is delayed by the second delay circuit 430, then delayed by the first delay circuit 420, and then by the third delay circuit 910. However, it is to be appreciated that the order of the first delay circuit 420, the second delay circuit 430, and the third delay circuit 910 in the segmented delay circuit 410 may be different in other implementations.

In this example, the first control circuit 440 also has a third output 922 coupled to a control input 916 of the third delay circuit 910. The first delay control signal may include a digital code d [H−1:0] indicating a number of fine delay steps $\tau_f$, which is the smallest delay step size of the segmented delay circuit 410 in this example.

For the example where the phase detector 310 is implemented with the bang-bang phase detector, the first control circuit 440 may increment the first delay control signal when the phase-error signal has the first value (e.g., 1) and decrement the first delay control signal when the phase-error signal has the second value (e.g., −1). In this example, the phase detector 310 may output the phase-error signal for each period (e.g., cycle) of the reference signal Ref, in which case the first delay control signal may be updated once per period of the reference signal Ref.

The first delay control signal is split between the first output 444, the second output 446, and the third output 922 of the first control circuit 440, in which a first of portion of the first delay control signal is output at the first output 444, a second portion of the control signal is output at the second output 446, and a third portion of the first delay control signal is output at the third output 922. Thus, in this example, the control input 426 of the first delay circuit 420 receives the first portion of the first delay control signal, the control input 436 of the second delay circuit 430 receives the second portion of the first delay control signal, and the control input 916 of the third delay circuit 910 receives the third portion of the first delay control signal.

For the example in which the first delay control signal includes digital code d [H−1:0] indicating a number of fine delay steps $\tau_f$, the first delay control signal includes a first portion of the digital code d [G−1:J], the second portion of the first delay control signal includes a second portion of the digital code d[H−1:G], and the third portion of the first delay control signal includes a third portion of the digital code d [J−1:0]. The bits in the first portion of the digital code d [G−1:J] are lower order than the bits in the second portion of the digital code d [H−1:G] and higher order than the bits in the third portion of the digital code d [J−1:0]. The bits in the second portion of the digital code d [H−1:G] are higher order than the bits in both the first portion of the digital code d [G−1:J] and the third portion of the digital code d [J−1:0]. The bits in the third portion of the digital code d [J−1:0] are lower order than the bits in both the second portion of the digital code d [H−1:G] and the first portion of the digital code d [G−1:J].

In this example, the first portion of the digital code d [G−1:J] includes first bits indicating a number of delay steps $\tau$ (e.g., a number of delay steps $\tau$ within one coarse delay step T0. The second portion of the digital code d [H−1:G] includes second bits indicating a number of coarse delay steps $\tau_c$, assuming that the multiple c discussed above is a power of two. The third portion of the digital code d [J−1:0] includes third bits indicating a number of fine delay steps $\tau_f$, assuming the divider D discussed above is a power of two. Making the multiple c a power of two and the divider D a power of two allows the delay control bits (i.e., d [G−1:J]) for the first delay circuit 420, the delay control bits (i.e., d [H−1:G]) for the second delay circuit 430, and the delay control bits (i.e., d [J−1:0]) for the third delay circuit 910 to be concatenated into the digital code d [H−1:0] for the first delay control signal.

The first delay circuit 420 is configured to delay the reference signal with a delay step of τ based on the first portion of the first delay control signal. For the example where the first portion of the first delay control signal includes the first portion of the digital code d [G−1:J], the first delay circuit 420 may be configured to delay the reference signal by p·τ, where p is the number of delay steps τ indicated by the first portion of the digital code d [G−1:J]. As discussed above with reference to FIG. 4, the first delay circuit 420 may be implemented with the exemplary delay circuit 120 shown in FIG. 1, the exemplary delay circuit 220 shown in FIG. 2, or another delay circuit including delay devices that can be selectively placed in the delay path of the delay circuit (e.g., using switches, logic gates, and/or one or more multiplexers).

The second delay circuit 430 is configured to delay the reference signal with a coarse step of $\tau_c$ based on the second portion of the first delay control signal. As discussed above, one coarse delay step $\tau_c$ is equal to c·τ, where c is a multiple. For the example where the second portion of the first delay control signal includes the second portion of the digital code d [H−1:G], the second delay circuit 430 may be configured to delay the reference signal by q·$\tau_c$, where q is the number of coarse delay steps $\tau_c$ indicated by the second portion of the digital code d [H−1:G]. The second delay circuit 430 may be implemented, for example, with the exemplary implementation shown in FIG. 5 or FIG. 6.

The third delay circuit 910 is configured to delay the reference signal with a fine step of $\tau_f$ based on the third portion of the first delay control signal. As discussed above, one fine delay step $\tau_f$ is equal to τ/D, where D is a divider. For the example where the third portion of the first delay control signal includes the third portion of the digital code d [J−1:0], the third delay circuit 910 may be configured to delay the reference signal by s·$\tau_f$, where s is the number of fine delay steps $\tau_f$ indicated by the third portion of the digital code d [J−1:0]. Exemplary implementations of the third delay circuit 910 are discussed further below.

Figure 10:
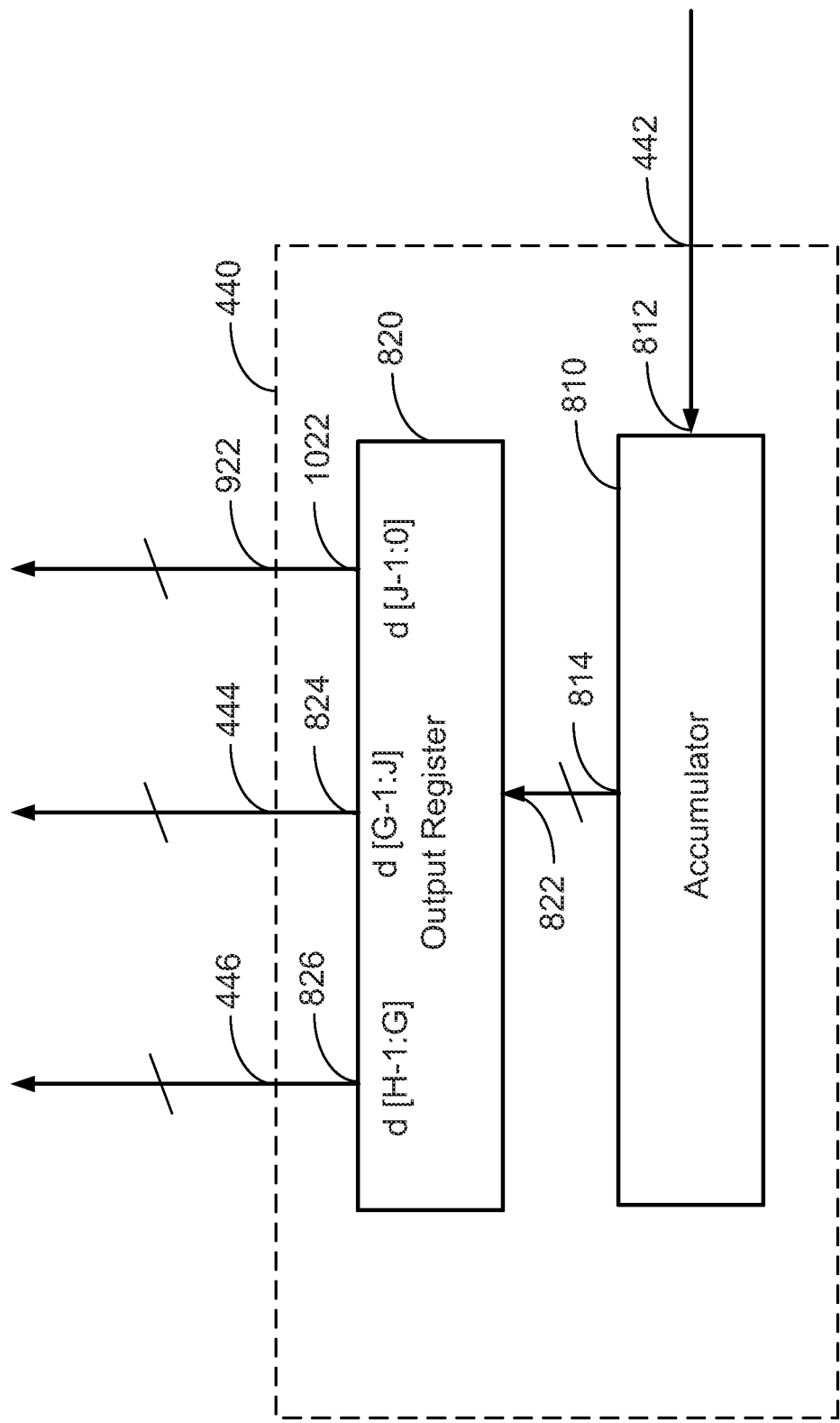
FIG. 10 shows another exemplary implementation of a control circuit according to certain aspects of the present disclosure.

FIG. 10 shows another exemplary implementation of the first control circuit 440 according to certain aspects. In this example, the output register 820 also has a third output 1022 coupled to the third output 922 of the first control circuit 440.

The accumulator 810 is configured to receive the phase-error signal from the phase detector 310 at the input 812, and increase or decrease the first delay control signal based on the phase-error signal. For the example where the phase detector 310 is implemented with a bang-bang phase detector, the accumulator 810 may increment the first delay control signal (e.g., digital coded [H−1:0]) when the phase-error signal has the first value (e.g., 1) and decrement the first delay control signal when the phase-error signal has the second value (e.g., −1). The accumulator 810 is configured to output the first delay control signal to the output register 820.

The output register 820 is configured to receive the first delay control signal (e.g., digital coded [H−1:0]) at the input 822, and hold the first delay control signal. The output register 820 outputs the first portion of the first delay control signal (e.g., d [G−1:J]) at the first output 824, outputs the second portion of the first delay control signal (e.g., d [H−1:G]) at the second output 826, and outputs the third portion of the first delay control signal (e.g., d [J−1:0]) at the third output 1022.

Figure 11:
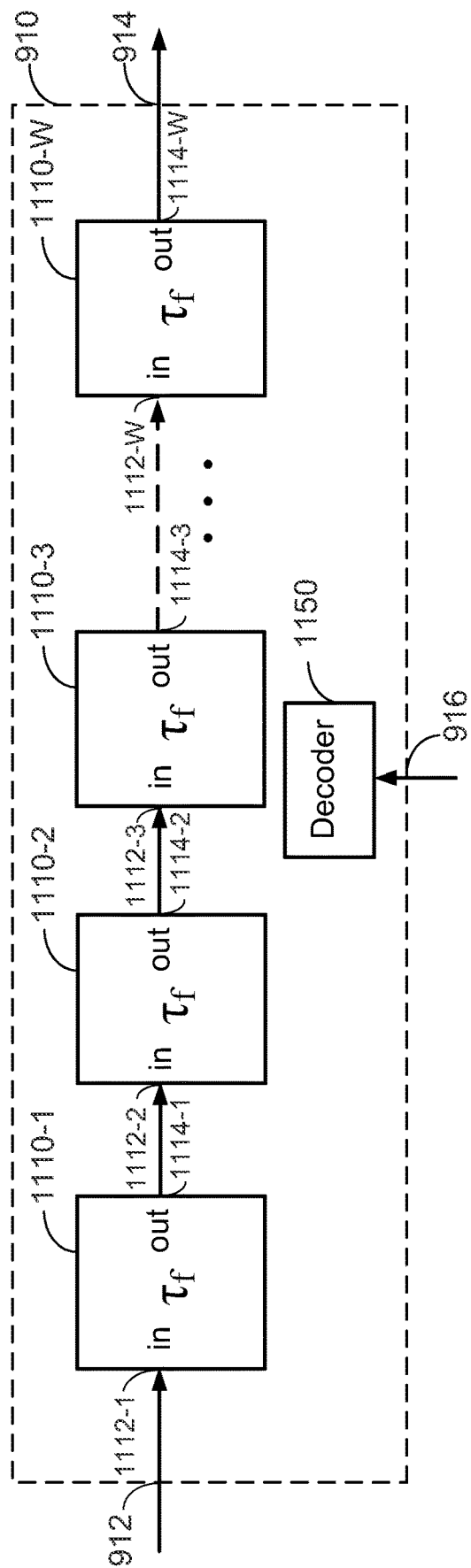
FIG. 11 shows an exemplary implementation of a fine delay circuit according to certain aspects of the present disclosure.

FIG. 11 shows an exemplary implementation of the third delay circuit 910 according to aspects of the present disclosure. In this example, the third delay circuit 910 includes multiple delay devices 1110-1 to 1110-W coupled in series to form a delay line (i.e., delay chain). Each of the delay devices 1110-1 to 1110-W has a respective input 1112-1 to 1112-W, and a respective output 1114-1 to 1114-W. The input 1112-1 of delay device 1110-1 is coupled to the input 912 of the third delay circuit 910, and the output 1114-W of delay device 1110-W is coupled to the output 914 of the third delay circuit 910.

The third delay circuit 910 also includes a decoder 1150 coupled to the control input 916. The decoder 950 is configured to receive the third portion of the first delay control signal and control the delay of the third delay circuit 910 based on the third portion of the first delay control signal by adjusting the delay of each of the delay devices 1110-1 to 1110-W. For example, each of the delay devices 1110-1 to 1110-W may include a variable capacitive load, in which the decoder 1150 adjusts the delay of each delay device 1110-1 to 1110-W by adjusting the respective capacitive load. In this example, the larger the capacitive load of a delay device, the longer the delay of the delay device. For ease of illustration, the individual connections between the decoder 1150 and the delay devices 1110-1 to 1110-W are not shown in FIG. 11.

Figure 12:
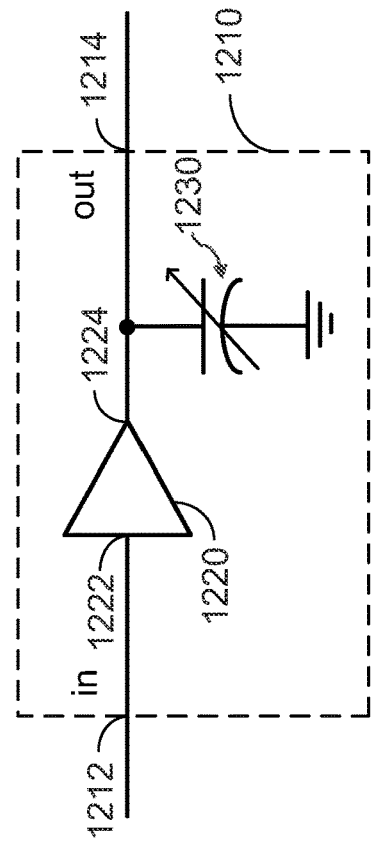
FIG. 12 shows an exemplary implementation of a delay device in the fine delay circuit according to certain aspects of the present disclosure.

FIG. 12 shows an exemplary implementation of a delay device 1210 that may be used to implement each of the delay devices 1110-1 to 1110-W shown in FIG. 11 (e.g., each of the delay devices 1110-1 to 1110-W may be a separate instance of the delay device 1210 in FIG. 12). In this example, the delay device 1210 has an input 1212 and an output 1214. The delay device 1210 includes a delay buffer 1220 and a variable capacitor 1230. The delay buffer 1220 has an input 1222 coupled to the input 1212 of the delay device 1210 and an output 1224 coupled to the output 1214 of the delay device 1210.

The variable capacitor 1230 is coupled to the output 1224 of the buffer 1220. In this example, the variable capacitor 1230 has an adjustable (i.e., tunable) capacitance that is controlled by the decoder 1150. This allows the decoder 1150 to adjust the capacitive load at the output 1224 of the delay buffer 1220 (and hence the delay of the delay device 1210) by adjusting the capacitance of the variable capacitor 1230. The larger the capacitance of the capacitor 1230, the larger the capacitive load, and hence the longer the delay of the delay device 1210.

It is to be appreciated that the third delay circuit 910 is not limited to the exemplary implementation shown in FIG. 11. In another example, the third delay circuit 910 is implemented with a delay interpolator. In this example, the first delay circuit 420 is configured to provide two delayed signals spaced one delay step τ apart, and the delay interpolator is configured to interpolate between the two delayed signals to provide a delay that is a fraction of one delay step τ.

Figure 13:
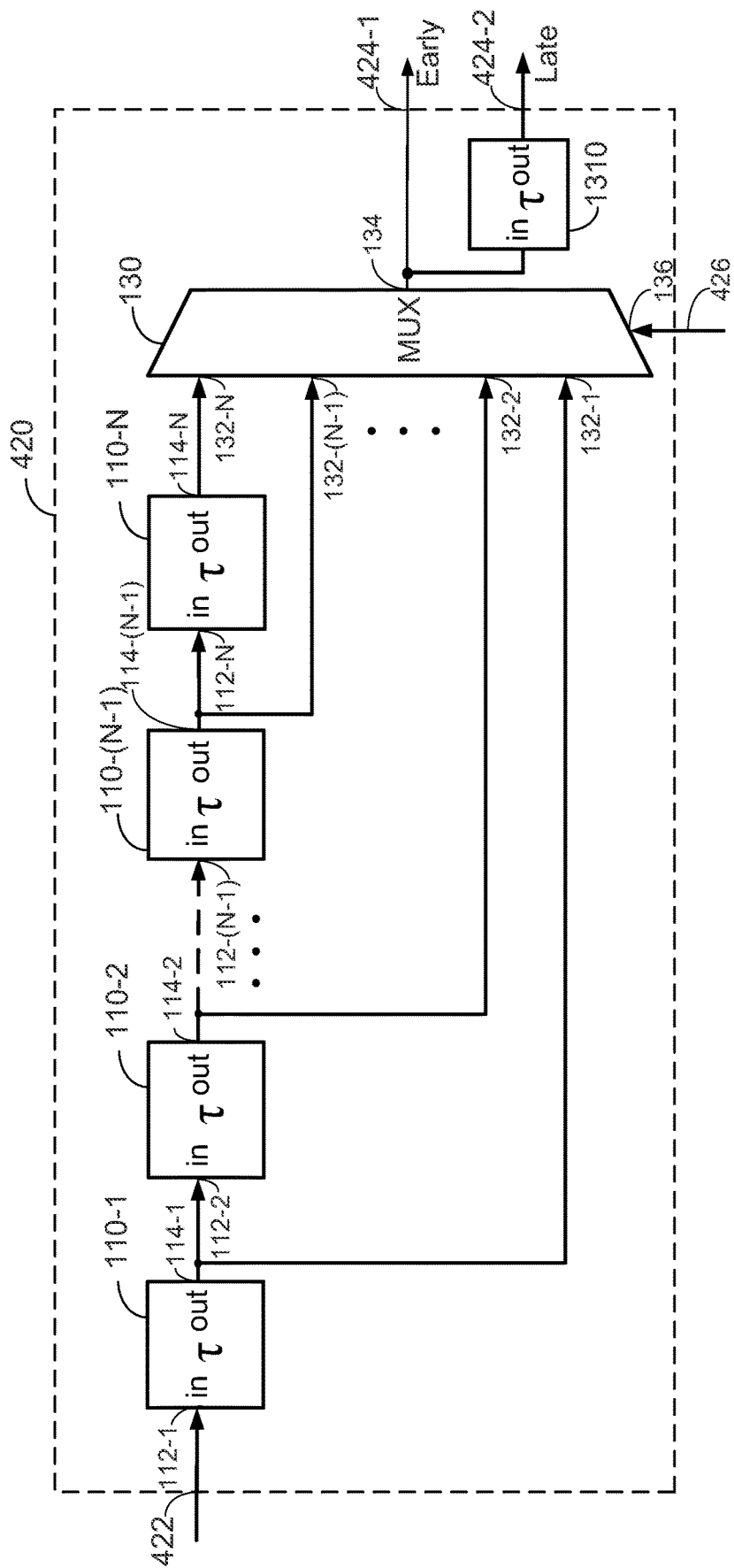
FIG. 13 shows an exemplary implementation of a delay circuit configured to produce an early delayed signal and a late delayed signal according to certain aspects of the present disclosure.

FIG. 13 shows an exemplary implementation in which the first delay circuit 420 is configured to provide two delayed signals for delay interpolation at the third delay circuit 910. In this example, the output 424 of the first delay circuit 420 includes a first output 424-1 and a second output 424-2. Also, the first delay circuit 420 includes the exemplary delay circuit 120 shown in FIG. 1 in which the input 112-1 of delay device 110-1 is coupled to the input 422 of the first delay circuit 420, the output 134 of the multiplexer 130 is coupled to the first output 424-1 of the first delay circuit 420, and the select input 136 of the multiplexer 130 is coupled to the control input 426 of the first delay circuit 420. The first delay circuit 420 also includes an additional delay device 1310 coupled between the output 134 of the multiplexer 130 and the second output 424-2.

In this example, the output 134 of the multiplexer 130 provides an early delayed signal (labeled "Early") at the first output 424-1. The delay device 1310 delays the delayed signal at the output 134 of the multiplexer 130 by one delay step τ to provide a late delayed signal (labeled "Late") at the second output 424-2, in which the early delayed signal and the late delayed signal are spaced apart by one delay step τ.

Figure 14:
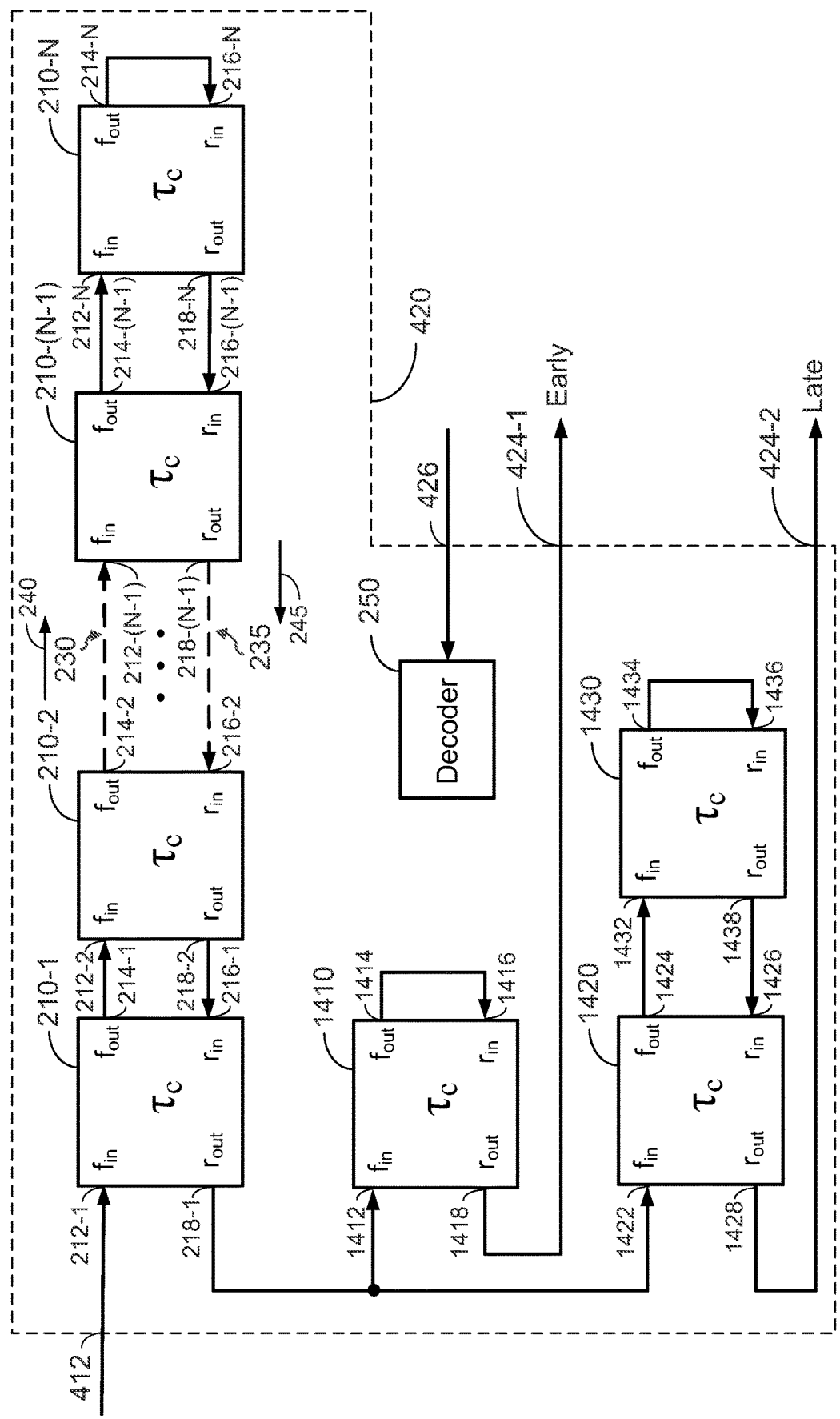
FIG. 14 shows another exemplary implementation of a delay circuit configured to produce an early delayed signal and a late delayed signal according to certain aspects of the present disclosure.

FIG. 14 shows another exemplary implementation in which the first delay circuit 420 is configured to provide two delayed signals for delay interpolation at the third delay circuit 910. In this example, the output 424 of the first delay circuit 420 includes a first output 424-1 and a second output 424-2. Also, the first delay circuit 420 includes the exemplary delay circuit 220 shown in FIG. 2, in which delay devices 210-1 to 210-N are coupled in a trombone configuration.

In this example, the input 212-1 of delay device 210-1 is coupled to the input 422 of the first delay circuit 420, and the decoder 250 is coupled to the control input 426 of the first delay circuit 420. As discussed above with reference to FIG. 2, the decoder 250 controls the delay at the second output 218-1 of delay device 210-1 by selecting the delay device in the trombone configuration that is used to route the signal from the forward path 230 to the return path 235. In this example, the decoder 250 adjusts (i.e., tunes) the delays of the early delayed signal and the late delayed signal based on the first portion of the delay control signal by selecting the delay device in the trombone configuration that is used to route the signal from the forward path 230 to the return path 235.

In this example, the first delay circuit 420 also includes a first delay device 1410, a second delay device 1420, and a third delay device 1430. Each of the delay devices 1410, 1420, and 1430 may be structurally the same or similar to a delay device in the trombone configuration.

In this example, the first input 1412 of the first delay device 1410 is coupled to the second output 218-1 of delay device 210-1, the first output 1414 of the first delay device 1410 is coupled to the second input 1416 of the first delay device 1410, and the second output 1418 of the first delay device 1410 is coupled to the first output 424-1 of the first delay circuit 420. The first delay device 1410 receives the signal from the second output 218-1 of delay device 210-1 and delays the signal by one coarse delay step to provide the early delayed signal at the first output 424-1 of the first delay circuit 20.

In this example, the first input 1422 of the second delay device 1420 is coupled to the second output 218-1 of delay device 210-1, the first output 1424 of the second delay device 1420 is coupled to the first input 1432 of the third delay device 1430, the first output 1434 of the third delay device 1430 is coupled to the second input 1436 of the third delay device 1430, the second output 1438 of the third delay device 1430 is coupled to the second input 1426 of the second delay device 1420, and the second output 1428 of the second delay device 1420 is coupled to the second output 424-2 of the first delay device 420. The second delay device 1420 receives the signal from the second output 218-1 of delay device 210-1. The second delay device 1420 and the third delay device 1430 delay the signal by two coarse delay steps to provide the late delayed signal at the second output 424-2 of the first delay circuit 420.

Thus, in this example, the early delayed signal is provided by delaying the signal from the second output 218-1 of delay device 210-1 by one coarse delay step using the first delay device 1410, and the late delayed signal is provided by delaying the signal from the second output 218-1 of delay device 210-1 by two coarse delay steps using the second delay device 1420 and the third delay device 1430. As a result, the early delayed signal and the late delayed signal are spaced apart by one coarse delay step τ in this example.

In the examples in FIGS. 13 and 14, the third delay circuit 910 is implemented with an interpolator configured to receive the early delayed signal and the late delayed signals from the first delay circuit 420, and interpolate between the early delayed signal and the late delayed signal (which are spaced one delay step τ apart) to produce a delay that is a fraction of one delay step τ. In certain aspects, the first control circuit 440 controls the fine delay of the third delay circuit 910 by controlling the delay interpolation using the third portion of the first delay control signal, as discussed further below.

Figure 15:
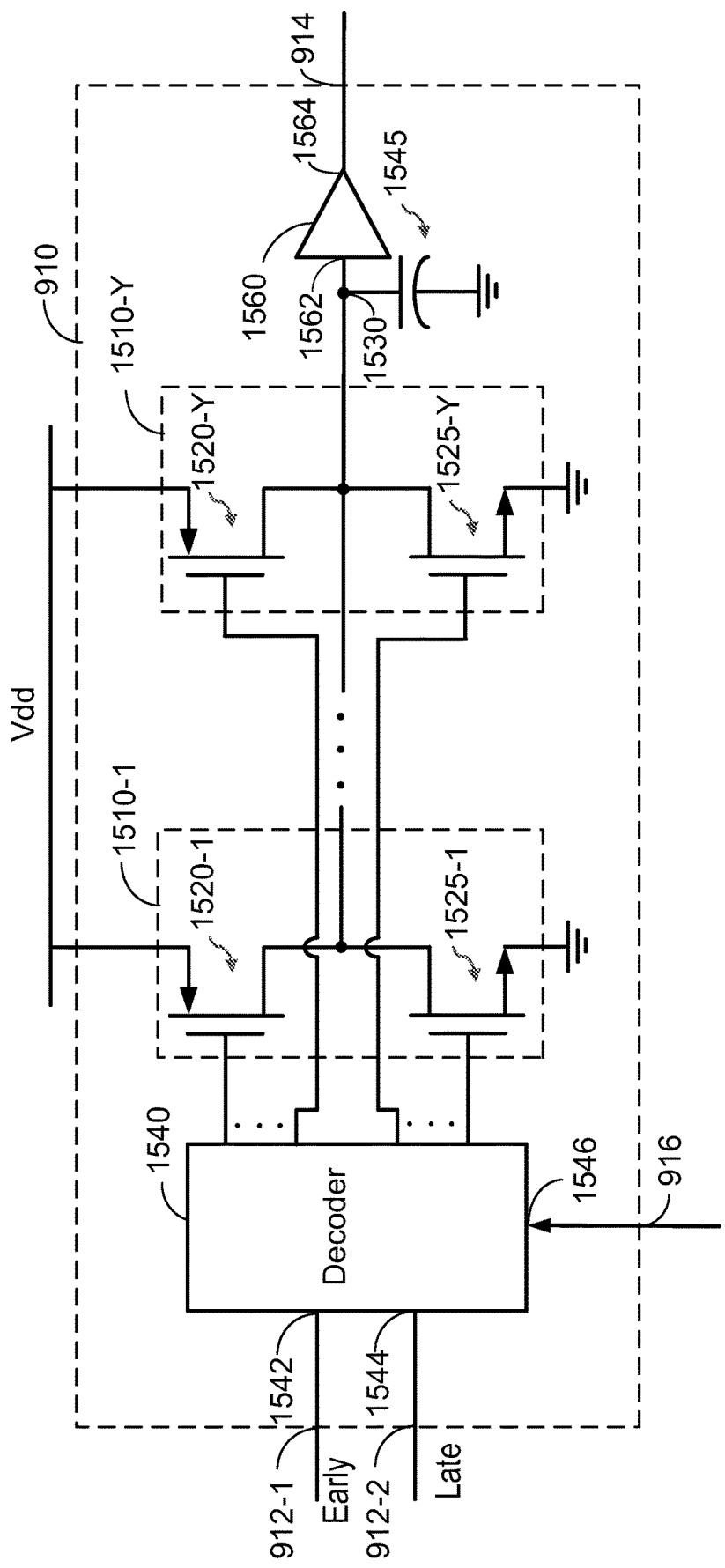
FIG. 15 shows another exemplary implementation of a fine delay circuit according to certain aspects of the present disclosure.

FIG. 15 shows an example of the third delay circuit 910 in which the third delay circuit 910 implements with a delay interpolator according to certain aspects of the present disclosure. In this example, the third delay circuit 910 includes multiple drivers 1510-1 to 1510-Y, a capacitor 1545, and an output buffer 1560.

Each of the drivers 1510-1 to 1510-Y includes a respective pull-up device 1520-1 to 1520-Y and a respective pull-down device 1525-1 to 1525-Y. Each of the pull-up devices 1520-1 to 1520-Y is coupled between a node 1530 and a voltage supply rail, in which the voltage supply rail provides a supply voltage Vdd. As discussed further below, each of the pull-up devices 1520-1 to 1520-Y is configured to pull the node 1530 high (e.g., pull the node 1530 up to Vdd) when the pull-up device is turned on. In the example in FIG. 15, each of the pull-up devices 1520-1 to 1520-Y is implemented with a respective transistor (e.g., respective p-type field effect transistor (PFET)).

Each of the pull-down devices 1525-1 to 1525-Y is coupled between the node 1530 and ground. As discussed further below, each of the pull-down devices 1525-1 to 1525-Y is configured to pull the node 1530 low (e.g., pull the node 1530 to ground) when the pull-down device is turned on. In the example in FIG. 15, each of the pull-down devices 1525-1 to 1525-Y is implemented with a respective transistor (e.g., respective n-type field effect transistor (NFET)).

The capacitor 1545 is coupled between the node 1530 and ground. The output buffer 1560 has an input 1562 coupled to the node 1530, and an output 1564 coupled to the output 914 of the third delay circuit 910. The output buffer 1560 may be implemented with one or more inverters or another type of output buffer.

In this example, the input 912 of the third delay circuit 910 includes a first input 912-1 and a second input 912-2. The first input 912-1 is coupled to the first output 424-1 of the first delay circuit 420 and the second input 912-1 is coupled to the second output 424-2 of the first delay circuit 420. The third delay circuit 910 includes a decoder 1540 having a first input 1542 coupled to the first input 912-1 of the third delay circuit 910, and a second input 1544 coupled to the second input 912-2 of the third delay circuit 910. Thus, the first input 1542 receives the early delayed signal and the second input 1544 receives the late delayed signal. The decoder 1540 also has a control input 1546 coupled to the control input 916 of the third delay circuit 910 and configured to receive the third portion of the first delay control signal. The decoder 1540 is also coupled to the drivers 1510-1 to 1510-Y, and more particularly, to the pull-up device 1520-1 to 1520-Y and pull-down device 1525-1 to 1525-Y of each driver 1510-1 to 1510-Y. For the example in which each of the pull-up devices 1520-1 to 1520-Y is implemented with a respective transistor, the decoder 1540 is coupled to the gate of each of the transistors. Also, for the example in which each of the pull-down devices 1525-1 to 1525-Y includes a respective transistor, the decoder 1540 is coupled to the gate of each of the transistors.

In one example, the decoder 1540 is configured to control the delay of the third delay circuit 910 by inputting the early delayed signal received at the first input 1542 to a programmable number of the drivers 1510-1 to 1510-Y based on the third portion of the delay control signal, and inputting the late delayed signal received at the second input 1544 to the remaining drivers 1510-1 to 1510-Y. In this example, the fine delay of the third delay circuit 910 is shorter when the programmable number is larger (i.e., the decoder 1540 inputs the early delayed signal to a larger number of the drivers 1510-1 to 1510-Y). Thus, in this example, the decoder 1540 controls the fine delay of the third delay circuit 910 by controlling the number of the drivers 1510-1 to 1510-Y that receive the early delayed signal based on the third portion of the delay control signal with the remaining drivers 1510-1 to 1510-Y receiving the late delayed signal.

As discussed above, in certain aspects, the pull-up devices 1520-1 to 1520-Y and the pull-down devices 1525-1 to 1525-Y of the drivers 1510-1 to 1510-Y are implemented with respective transistors. In these aspects, the decoder 1540 inputs the early delayed signal to a driver 1510-1 to 1510-Y by inputting the early delayed signal to the gate of the transistor of the respective pull-up device 1520-1 to 1520-Y and the gate of the transistor of the respective pull-down device 1525-1 to 1525-Y. The decoder 1540 inputs the late delayed signal to a driver 1510-1 to 1510-Y by inputting the late delayed signal to the gate of the transistor of the respective pull-up device 1520-1 to 1520-Y and the gate of the transistor of the respective pull-down device 1525-1 to 1525-Y.

Figure 16:
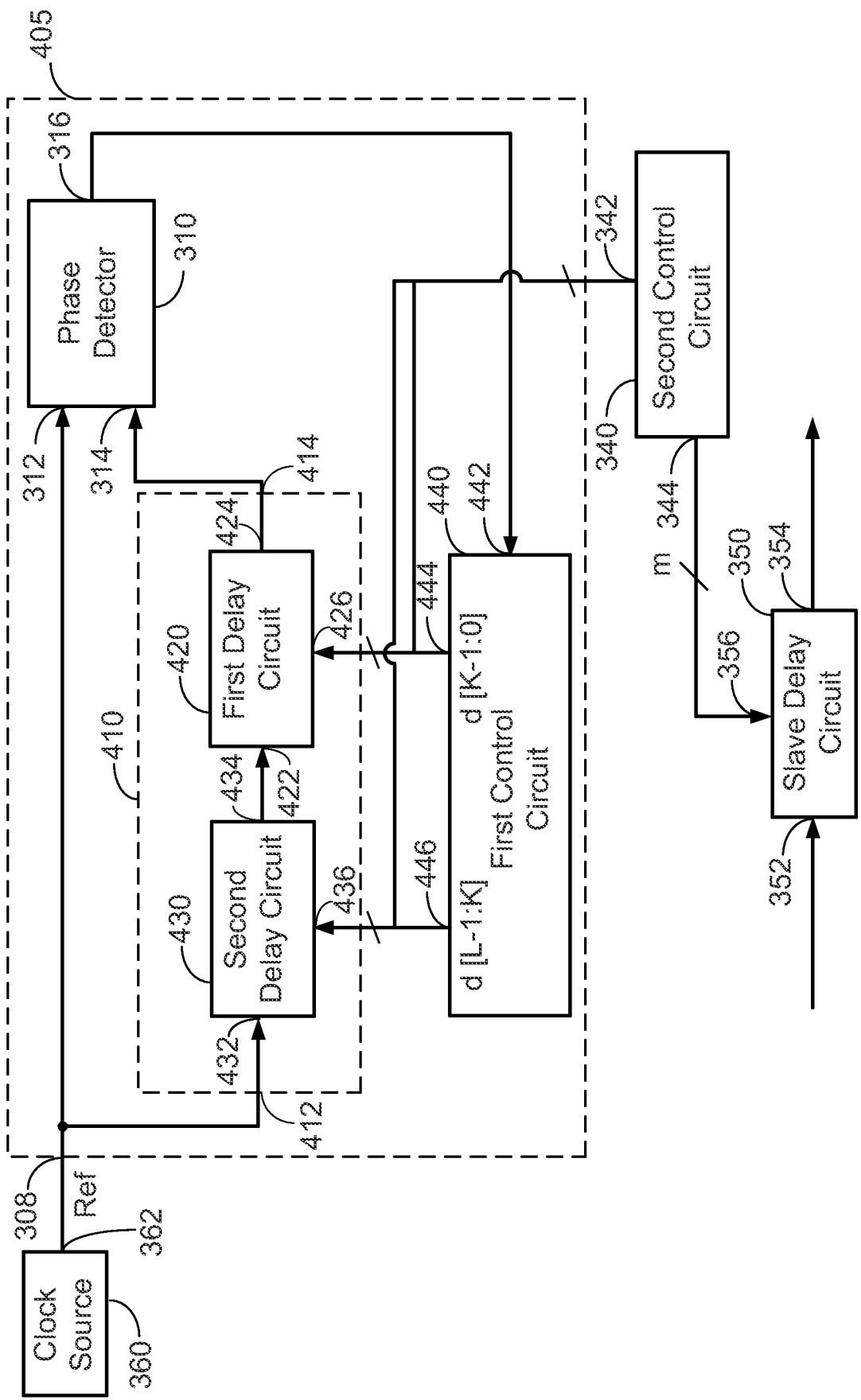
FIG. 16 shows an example of a system including a DLL, a second control circuit, and a slave delay circuit according to certain aspects of the present disclosure.

FIG. 16 shows an example of a system including the DLL 405, the second control circuit 340, and the slave delay circuit 350 according to aspects of the present disclosure. In this example, the input 342 of the second control circuit 340 is coupled to the first control circuit 440 to receive the first delay control signal (e.g., digital code d [L−1:0]), which indicates the number of delay steps τ in one reference period when the DLL 405 is locked. To receive the first delay control signal, the input 342 of the second control circuit 340 may be coupled to the first output 444 and the second output 446 of the first control circuit 440 (shown in the example in FIG. 16), the output 814 of the accumulator 810 (not shown in FIG. 16), or another part of the first control circuit 440 providing access to the first delay control signal.

The output 344 of the second control circuit 340 is coupled to the control input 356 of the slave delay circuit 350 to control the tunable delay of the slave delay circuit 350. As discussed above, the slave delay circuit 350 is configured to receive a signal at the input 352, delay the signal by the tunable delay, and output the delayed signal at the output 354. The signal may be a data signal, a clock signal, or another type of signal.

In operation, the second control circuit 340 receives the first delay control signal (e.g., digital code d [L−1:0]) from the first control circuit 440, which provides information on the number of delay steps τ in one reference period. The second control circuit 340 then determines the number of delay steps needed to achieve a desired delay for the slave delay circuit 350 based on the number of delay steps τ in one reference period provided by the first delay control signal. For example, the second control circuit 340 may determine the number of delay steps needed to achieve the desired delay by multiplying the number of delay steps τ in one reference period by the ratio $T_{DLY}/T_{REF}$, where $T_{DLY}$ is the desired delay and $T_{REF}$ is one reference period. The second control circuit 340 may then output the second delay control signal indicating the determined number of delay steps τ needed to achieve the desired delay to the control input 356 of the slave delay circuit 350.

The slave delay circuit 350 may include multiple selectable delay devices (not shown in FIG. 16), where each of the delay devices has a delay of one delay step τ. In this example, the slave delay circuit 350 allows the second control circuit 340 to adjust (i.e., tune) the delay of the slave delay circuit 350 with a delay step of τ by controlling the number of the delay devices in the delay path of the slave delay circuit 350 using the second delay control signal. The slave delay circuit 350 may be implemented with the exemplary delay circuit 120 shown in FIG. 1, in which the input 122, the output 124, and the control input 126 in FIG. 1 correspond to the input 352, the output 354, and the control input 356 in FIG. 16, respectively. The slave delay circuit 350 may also be implemented with the exemplary delay circuit 220 shown in FIG. 2, in which the input 222, the output 224, and the control input 226 in FIG. 2 correspond to the input 352, the output 354, and the control input 356 in FIG. 16, respectively. However, it is to be appreciated that the slave delay circuit 350 is not limited to these examples. In one example, the second delay control signal includes a digital code indicating the number m of delay steps τ in the desired delay for the slave delay circuit 350. In this example, the slave delay circuit 350 places m delay devices in the delay path of the slave delay circuit 350 based on the second delay control signal to achieve the desired delay.

The segmented delay circuit 410 in the DLL 405 allows the delay step τ of the slave delay circuit 350 to be much smaller than one reference period while substantially reducing the area and cost of the DLL 405 compared with the DLL 305 in FIG. 3. This is because the unsegmented delay circuit 320 in the DLL 305 requires a very large number of delay devices in order to achieve a sufficiently wide delay tuning range to produce a delay of one reference period, which increases the area and cost of the DLL 305. In contrast, the segmented delay circuit 410 includes the second delay circuit 430 which provides the segmented delay circuit 410 with coarse delay adjustments. The coarse delay adjustments allow the segmented delay circuit 410 to achieve a wide delay tuning rage using much fewer delay devices than the unsegmented delay circuit 320 while the fine delay adjustments provided by the first delay circuit 420 allows the segmented delay circuit 410 to still achieve the same delay tuning resolution of one delay step τ. For example, if one reference period equals one thousand delay steps τ, then the unsegmented delay circuit 320 requires at least one thousand delay devices to produce a delay of one reference period. In contrast, the second delay circuit 430 in the segmented delay circuit 410 can achieve the same wide tuning range using much fewer delay devices (e.g., by counting oscillations of a ring oscillator to produce a large delay where the ring oscillator includes a relatively small number of delay devices).

Figure 17:
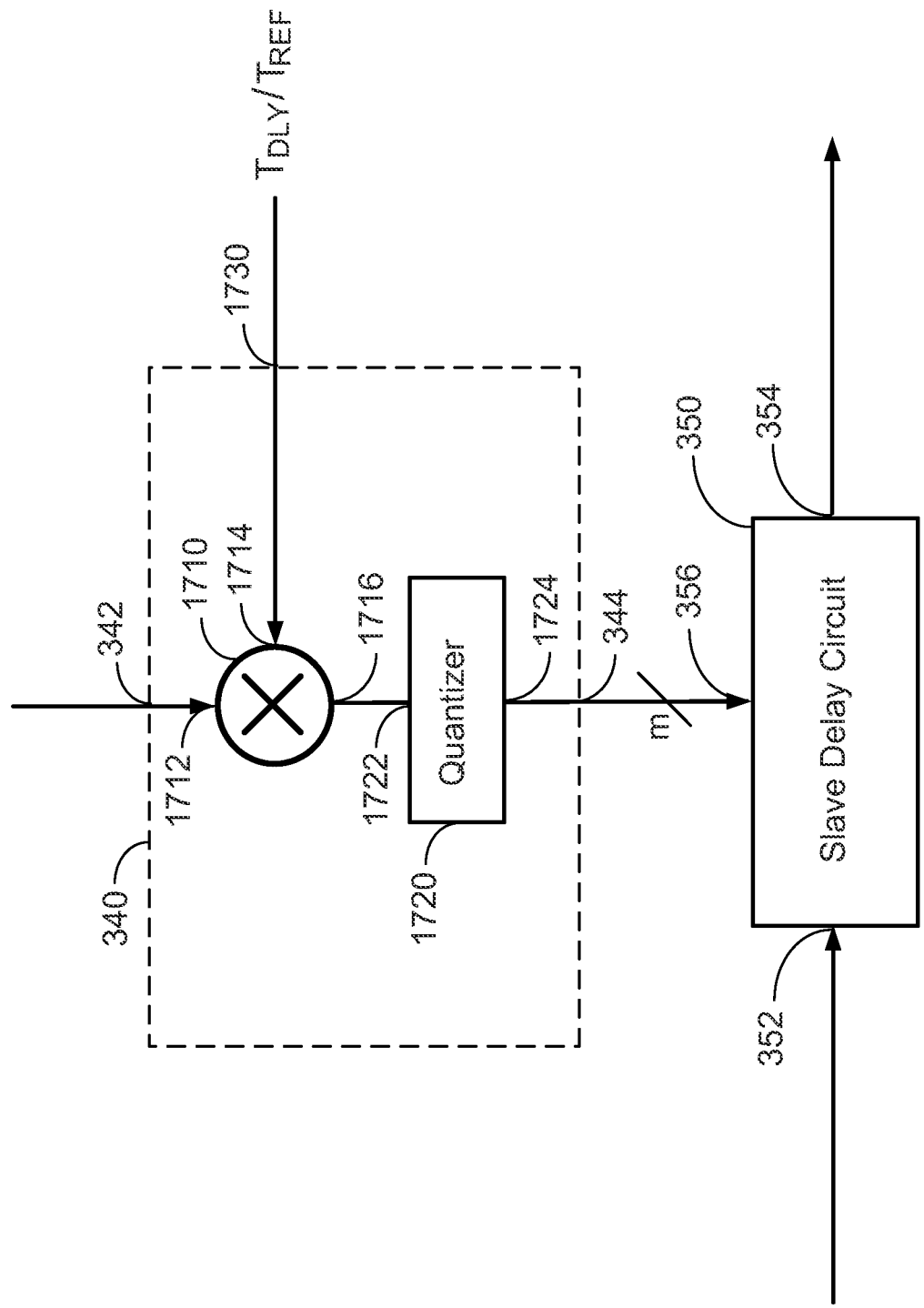
FIG. 17 shows an exemplary implementation of a second control circuit according to certain aspects of the present disclosure.

FIG. 17 shows an exemplary implementation of the second control circuit 340 according to certain aspects. In this example, the second control circuit 340 includes a multiplier 1710 and a quantizer 1720. The multiplier 1710 has a first input 1712, a second input 1714, and an output

1716. The first input 1712 of the multiplier 1710 is coupled to the input 342 of the second control circuit 340, and the second input 1714 of the multiplier 1710 is coupled to a control input 1730 of the second control circuit 340. The quantizer 1720 has an input 1722 and an output 1724. The input 1722 of the quantizer 1720 is coupled to the output 1716 of the multiplier 1710, and the output 1724 of the quantizer 1720 is coupled to the output 344 of the second control circuit 340.

In operation, the multiplier 1710 receives the first delay control signal at the first input 1712. In one example, the first delay control signal is a digital code (e.g., digital code d [L:0]) indicating the number of delay steps $\tau$ in one reference period. The multiplier 1710 also receives a third delay control signal at the second input 1714 indicating a desired delayed for the slave delay circuit 350. For example, the third delay control signal may indicate a ratio of the desired delay over one reference period (i.e., $T_{DLY}/T_{REF}$ where $T_{DLY}$ is the desired delay the $T_{REF}$ is one reference period). The multiplier 1710 multiplies the first delay control signal with the third delay control signal to generate a signal indicating a number of delay steps in the desired delay for the slave delay circuit 350. The quantizer 1720 may then quantize the signal from the multiplier 1710 to generate the second delay control signal. For example, the signal from the multiplier 1710 may include a fractional delay step. In this example, the quantizer 1720 may remove the fractional delay step or round the signal from the multiplier 1710 to the nearest integer to generate the second control delay signal. In this example, the second delay control signal indicates the number m of delay steps $\tau$ needed to achieve the desired delay for the slave delay circuit 350.

As discussed above, the slave delay circuit 350 may include multiple selectable delay devices (not shown in FIG. 16), where each of the delay devices has a delay of one delay step $\tau$. In this example, the slave delay circuit 350 achieves the desired delay by placing a number of the delay devices in the delay path of the slave delay circuit 350 according to the number of delay steps indicated in the second delay control signal. For the example where each delay device has a delay approximately equal to one delay step, the slave delay circuit 350 may place a number of delay devices in the delay path equal to the number of delay steps indicated in the second delay control signal.

Figure 18:
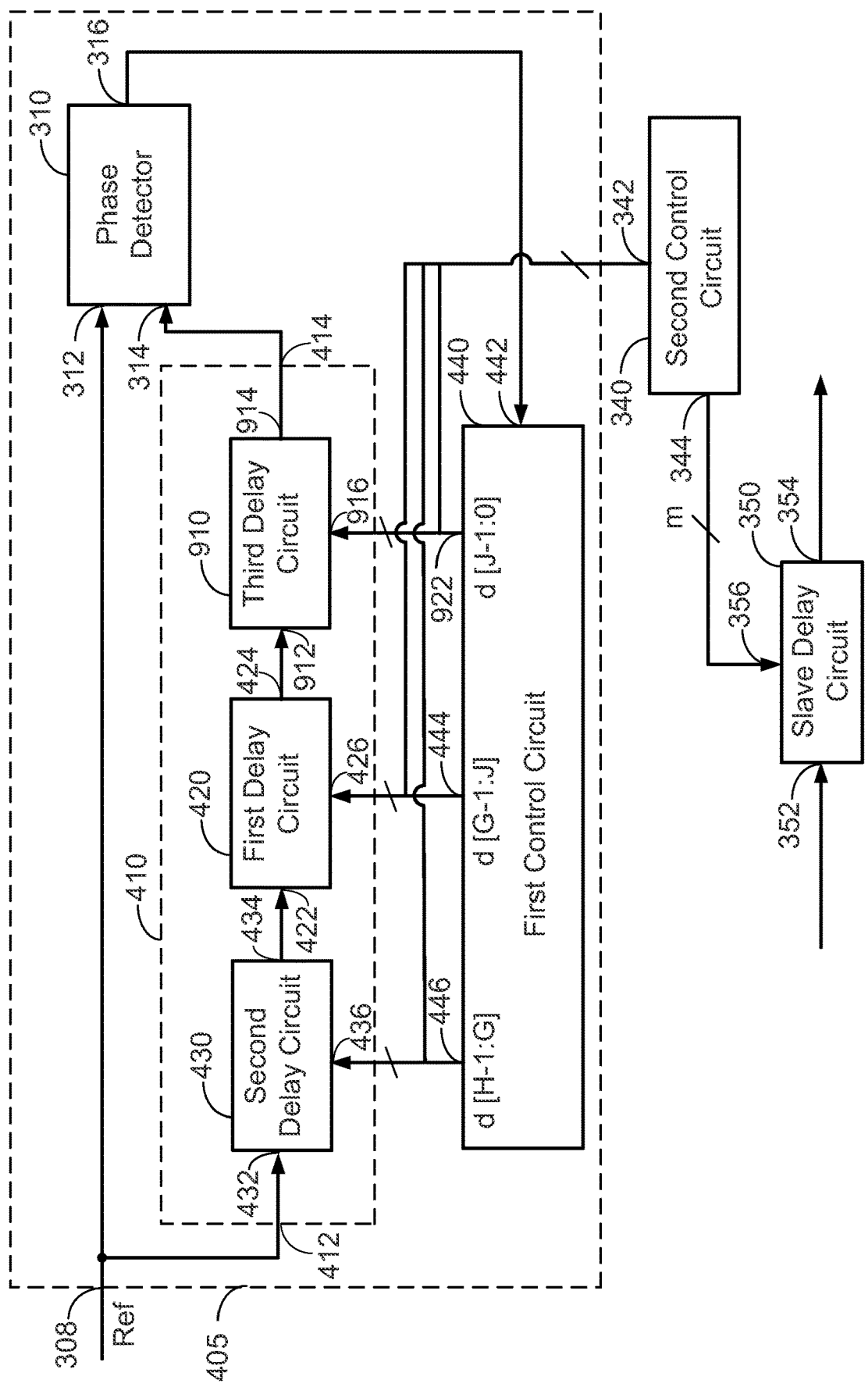
FIG. 18 shows another example of a system including a DLL, a second control circuit, and a slave delay circuit according to certain aspects of the present disclosure.

FIG. 18 shows another example of a system including the DLL 405, the second control circuit 340, and the slave delay circuit 350 according to aspects of the present disclosure. In this example, the segmented delay circuit 410 includes the third delay circuit 910, which provides fine delay adjustments in fine delay step $\tau_f$ as discussed above. Also, in this example, the first delay control signal (e.g., digital code d [H−1:0]) indicates the number of fine delay steps in one reference period when the DLL 405 is locked.

The input 342 of the second control circuit 340 is coupled to the first control circuit 440 to receive the first delay control signal (e.g., digital code d [H−1:0]). To receive the first delay control signal, the input 342 of the second control circuit 340 may be coupled to the first output 444, the second output 446, and the third output 922 of the first control circuit 440 (shown in the example in FIG. 18), the output 814 of the accumulator 810 (not shown in FIG. 18), or another part of the first control circuit 440 providing access to the first delay control signal.

The output 344 of the second control circuit 340 is coupled to the control input 356 of the slave delay circuit 350 to control the tunable delay of the slave delay circuit 350. As discussed above, the slave delay circuit 350 is configured to receive a signal at the input 352, delay the signal by the tunable delay, and output the delayed signal at the output 354. The signal may be a data signal, a clock signal, or another type of signal. In this example, the slave delay circuit 350 may be configured to tune the tunable delay of the slave delay circuit 350 in fine delay steps.

In operation, the second control circuit 340 receives the first delay control signal (e.g., digital code d [H−1:0]) from the first control circuit 440, which provides information on the number of fine delay steps $\tau_f$ in one reference period. The second control circuit 340 then determines the number of fine delay steps needed to achieve a desired delay for the slave delay circuit 350 based on the number of fine delay steps $\tau_f$ in one reference period provided by the first delay control signal. For example, the second control circuit 340 may determine the number of delay steps needed to achieve the desired delay by multiplying the number of fine delay steps $\tau_f$ in one reference period by the ratio $T_{DLY}/T_{REF}$, where $T_{DLY}$ is the desired delay and $T_{REF}$ is one reference period. The second control circuit 340 may then output the second delay control signal indicating the determined number m of fine delay steps $\tau_f$ needed to achieve the desired delay to the control input 356 of the slave delay circuit 350.

Figure 19:
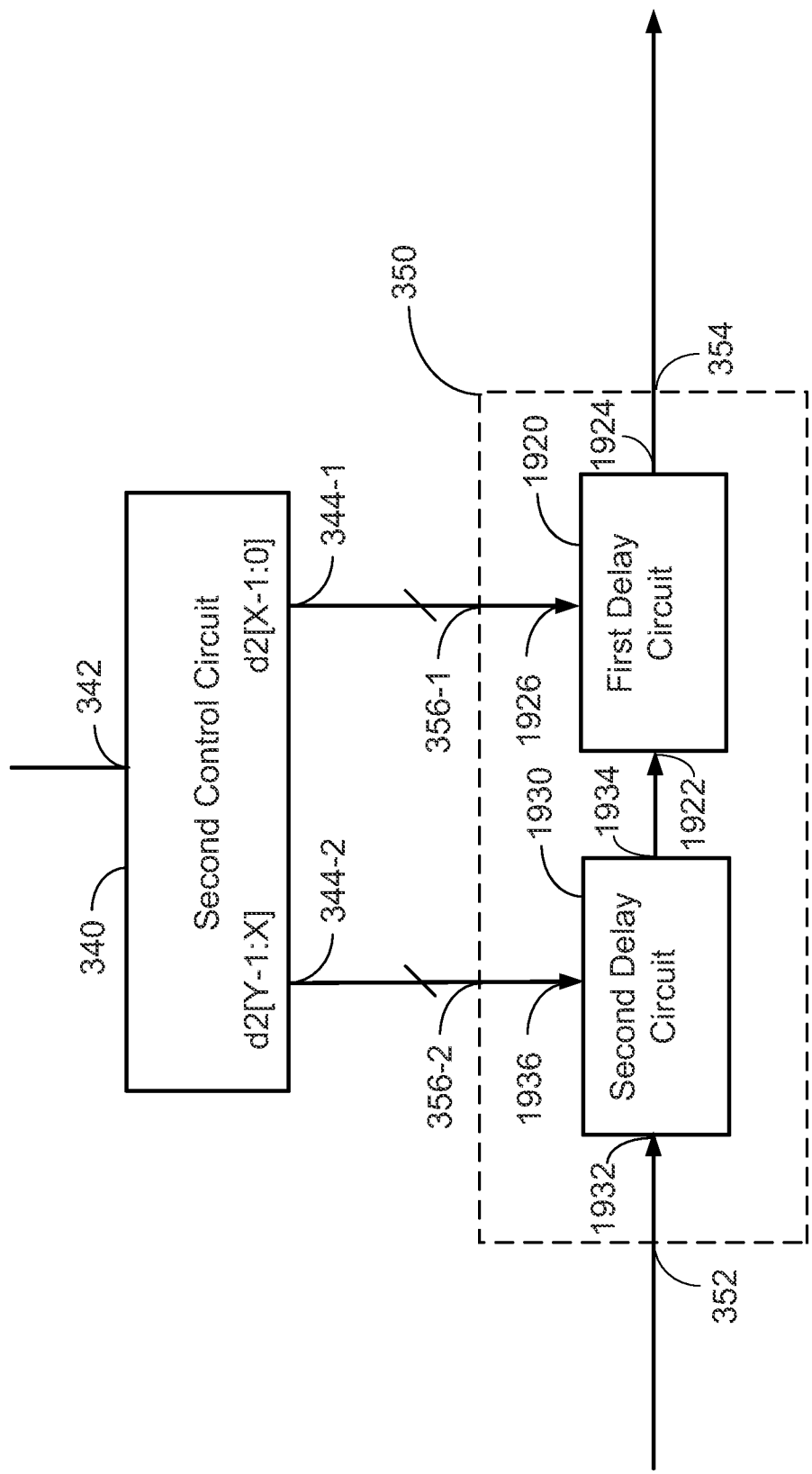
FIG. 19 shows an example in which a slave delay circuit is implemented with a segmented delay circuit according to certain aspects of the present disclosure.

In response to the second delay control signal, the slave delay circuit 350 sets the delay of the slave delay circuit 350 to the desired delay. In this example, the slave delay circuit 350 may be implemented with a segmented delay circuit. In this regard, FIG. 19 shows an example in which the slave delay circuit 350 includes a first delay circuit 1920 and a second delay circuit 1930 coupled in series between the input 352 and the output 354 of the slave delay circuit 350. In this example, the second delay circuit 1930 has an input 1932 coupled to the input 352 of the slave delay circuit 350, and an output 1934. The second delay circuit 1930 is configured to delay the signal at the input 1932 with the delay step of $\tau$. The first delay circuit 1920 has an input 1922 coupled to the output 1934 of the second delay circuit 1930, and an output 1924 coupled to the output 354 of the slave delay circuit 350. The first delay circuit 1920 is configured to delay the signal at the input 1922 with the fine delay step of $\tau_f$.

In this example, the second delay circuit 1930 may be implemented with the exemplary delay circuit shown in FIG. 1, FIG. 2, FIG. 13, or FIG. 14. However, it is to be appreciated that the second delay circuit 1930 is not limited to these examples. The first delay circuit 1920 may be implemented with the exemplary delay circuit shown in FIG. 11 or FIG. 15. However, it is to be appreciated that the first delay circuit 1920 is not limited to these examples. For the example where the first delay circuit 1920 implements a delay interpolator, the output 1934 of the second delay circuit 1930 may include a first output and a second output for outputting the early delayed signal and the late delayed signal, respectively. In this example, the input 1922 of the first delay circuit 1920 may include a first input coupled to the first output for receiving the early delayed signal, and a second input coupled to the second output for receiving the late delayed signal.

In this example, the output 344 of the second control circuit 340 includes a first output 344-1 coupled to the control input 1926 of the first delay circuit 1920, and a second output 344-2 coupled to the control input 1936 of the second delay circuit 1930. In this example, the second delay control signal may be a digital code d2 [Y−1:0] indicating the number of fine delay steps in the desired delay for the slave delay circuit 350.

In operation, the second control circuit 340 generates the second delay control signal indicating the number of fine delay steps in the desired delay for the slave delay circuit 350. The second control circuit 340 may split the second delay control signal into a first portion and a second portion, in which the first portion is output from the first output 344-1 to the control input 1926 of the first delay circuit 1920 and the second portion is output from the second output 344-2 to the control input 1936 of the second delay circuit 1930. In this example, the second delay control signal may include the digital code d2 [Y−1:0] where the first portion of the second delay control signal includes first bits d2 [X−1:0] of the digital code and the second portion of the second delay control signal includes second bits d2 [Y−1:X] of the digital code, in which the second bits d2 [Y−1:X] are higher order relative to the first bits d2 [X−1:0].

The first delay circuit 1920 sets the delay of the first delay circuit 1920 based on the first portion of the second delay control signal, and the second delay circuit 1930 sets the delay of the second delay circuit 1930 based on the second portion of the second delay control signal. For example, the second portion of the second delay control signal (e.g., first bits d2 [Y−1:X]) may indicate a number of delay steps τ. In this example, the second delay circuit 1930 may set the delay of the second delay circuit 1930 to a delay equal to the number of delay steps τ indicated in the second portion of the second delay control signal. The first portion of the second delay control signal (e.g., second bits d2 [X−1:0]) may indicate a number of fine delay steps $\tau_f$. In this example, the first delay circuit 1920 may set the delay of the first delay circuit 1920 equal to the number of fine delay steps $\tau_f$ indicated in the first portion of the second delay control signal. In this example, the control input 356 of the slave delay circuit 350 includes a first input 356-1 coupled to the control input 1926 of the first delay circuit 1920, and a second input 356-2 coupled to the control input 1936 of the second delay circuit 1930.

In certain aspects, the second control circuit 340 may be implemented with the exemplary implementation shown in FIG. 17. In this example, the output 1724 of the quantizer 1720 is coupled to the first output 344-1 and the second output 344-2 of the second control circuit 340. In this example, the second delay control signal output from the quantizer 1720 is split between the first output 344-1 and the second output 344-2 with the first portion of the second delay control signal being output at the first output 344-1 and the second portion of the second delay control signal being output at the second output 344-2.

Figure 20:
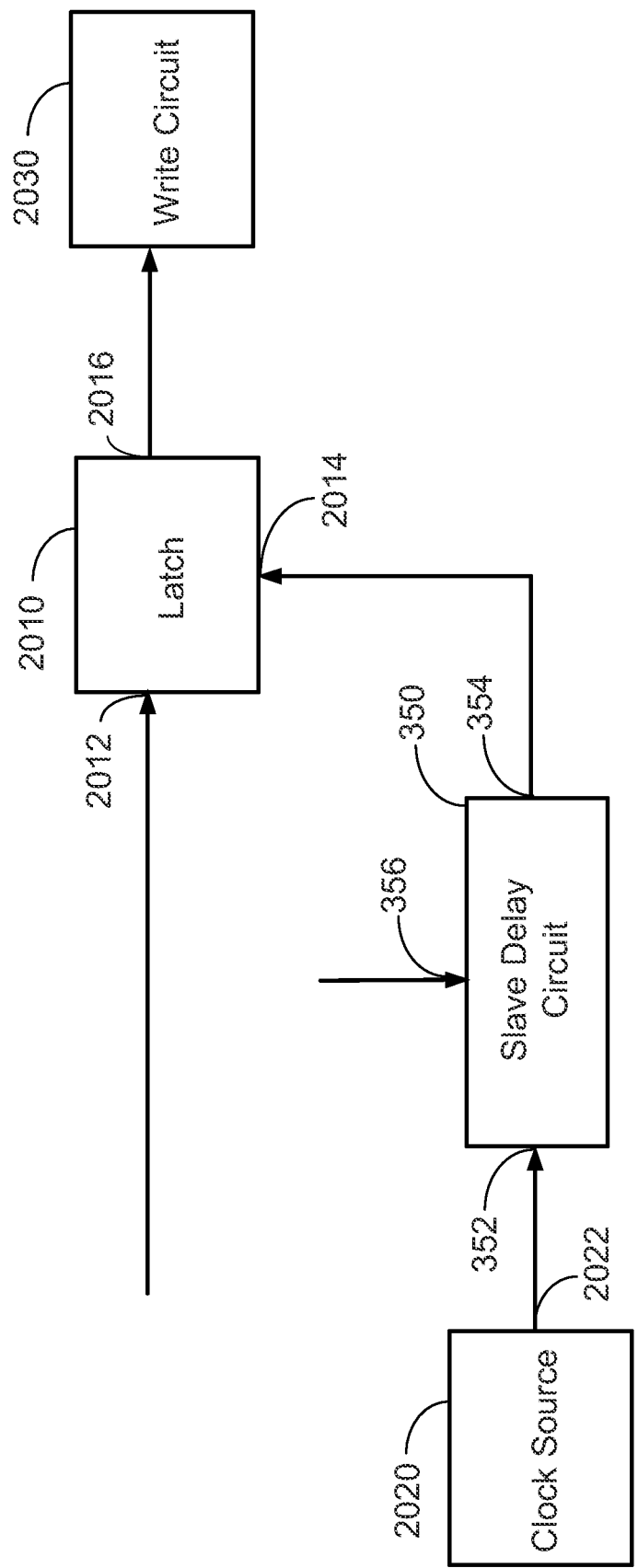
FIG. 20 shows an example in which a slave delay circuit is used to delay a clock signal for a latch according to certain aspects of the present disclosure.

FIG. 20 shows an example in which the slave delay circuit 350 is used to delay a clock signal used for data capture by a latch 2010. In this example, the latch 2010 has a data input 2012, a clock input 2014, and an output 2016. The clock input 2014 of the latch 2010 is coupled to the output 354 of the slave delay circuit 350.

In this example, the slave delay circuit 350 receives a clock signal at the input 352, delays the clock signal, and outputs the delayed clock signal at the output 354, which is coupled to the clock input 2014 of the latch 2010. The latch 2010 receives a data signal at the data input 2012 and receives the delayed clock signal at the clock input 2014. The latch 2010 is configured to capture (i.e., latch) data bits from the received data signal on rising edges and/or falling edges of the delayed clock signal, and output the data bits at the output 2016. In this example, the slave delay circuit 350 may be used to delay the clock signal in order to center edges of the clock signal between transitions of the data signal. The latch 2010 may be implemented with a flip flop or another type of latch.

For an example in which the latch 2010 is used in a memory interface, the output 2016 of the latch 2010 may be coupled to a write circuit 2030 configured to write the data bits to a memory (not shown). In another example, the output 2016 of the latch 2010 may be coupled to a data processor (not shown) configured to process the data bits.

In certain aspects, the clock signal may be provided by a clock source 2020 having an output 2022 coupled to the input 352 of the slave delay circuit 350. The clock source 2020 may include a phase locked loop (PLL), a DLL, a clock recovery circuit, or another type of clock source. In this example, the clock source 2020 may generate the clock signal and output the clock signal at the output 2022.

Figure 21:
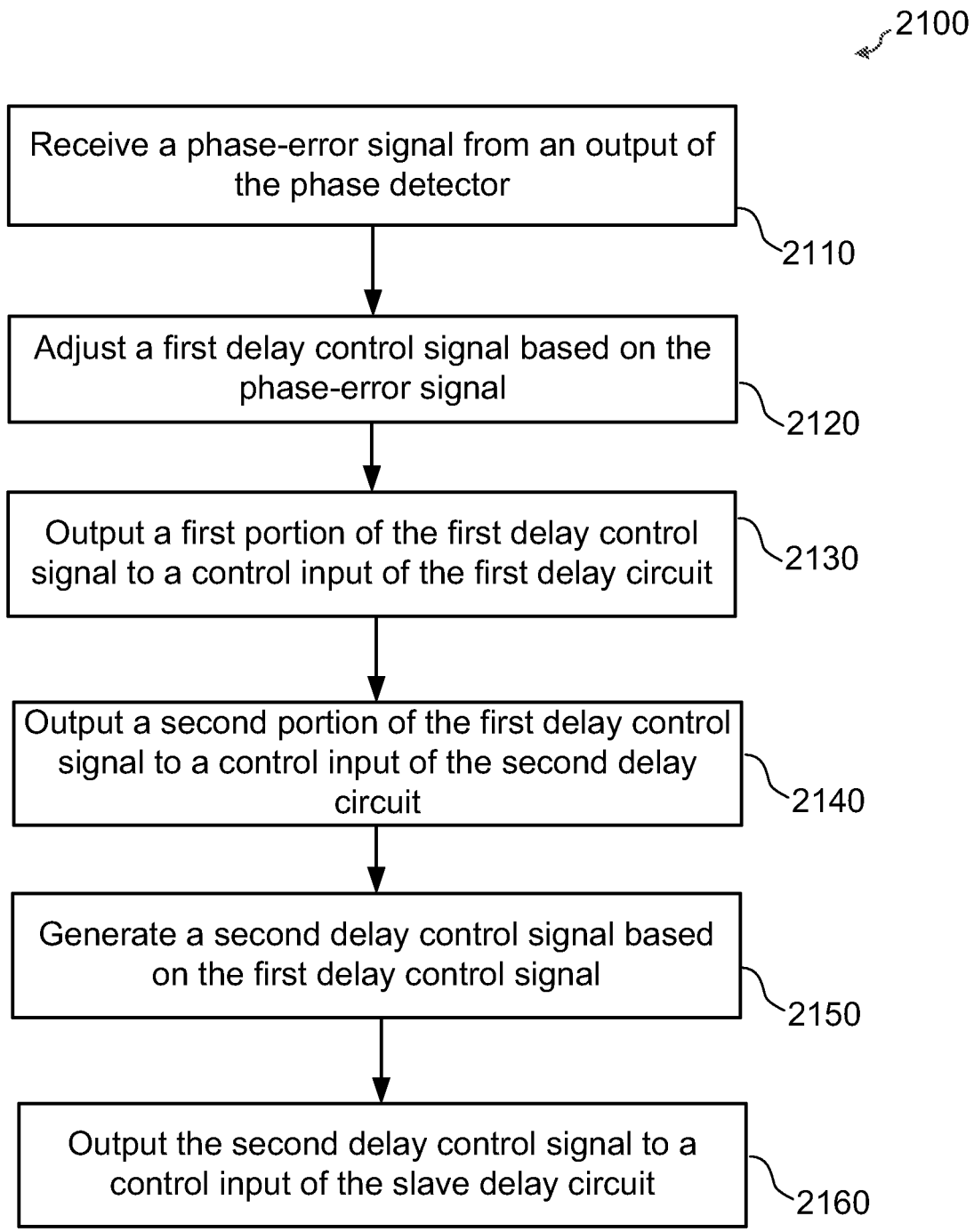
FIG. 21 is a flowchart illustrating a method of operation of a system including a DLL and a slave delay circuit according to certain aspects of the present disclosure.

FIG. 21 illustrates a method 2100 of operating a system including a delay locked loop (DLL) and a slave delay circuit according to certain aspects. The DLL (e.g., DLL 405) includes a phase detector (e.g., phase detector 310), a first delay circuit (e.g., first delay circuit 420), and a second delay circuit (e.g., second delay circuit 430), wherein a first input (e.g., first input 312) of the phase detector is coupled to an input (e.g., input 308) of the DLL, and the first delay circuit and the second delay circuit are coupled in series between the input of the DLL and a second input (e.g., second input 314) of the phase detector.

At block 2110, a phase-error signal is received from an output of the phase detector. For example, the phase-error signal may be received by the first control circuit 440.

At block 2120, a first delay control signal is adjusted based on the phase-error signal. For example, the first delay control signal may be adjusted by the first control circuit 440. In one example, the first delay control signal includes a digital code (e.g., d [L−1:0]), and adjusting the first delay control signal includes incrementing the digital code if the phase-error signal has a first value (e.g., 1), and decrementing the digital code if the phase-error signal has a second value (e.g., −1). In this example, the digital code may be incremented or decremented by the accumulator 810.

At block 2130, a first portion of the first delay control signal is output to a control input of the first delay circuit. For example, the first portion of the first delay control signal may be output by the first control circuit 440.

At block 2140, a second portion of the first delay control signal is output to a control input of the second delay circuit. For example, the second portion of the first delay control signal may be output by the first control circuit 440. In certain aspects, the first portion of the first delay control signal includes first bits (e.g., d [K−1:0]), the second portion of the first delay control signal (e.g., d [L−1:K]) includes second bits, and the second bits are higher order than the first bits.

At block 2150, a second delay control signal is generated based on the first delay control signal. For example, generating the second delay control signal based on the first delay control signal may include multiplying the first delay control signal with a third delay control signal (e.g., using the multiplier 1710). In this example, the third delay control signal may include a ratio of a delay for the slave delay circuit over a period of a reference clock signal (e.g., $T_{DLY}/T_{REF}$).

At block 2160, the second delay control signal is output to a control input of the slave delay circuit. In one example, the slave delay circuit (e.g., slave delay circuit 350) includes a third delay circuit (e.g., first delay circuit 1920), and a fourth delay circuit (e.g., second delay circuit 1930) coupled in series with the third delay circuit. In this example, outputting the second delay control signal may include outputting a first portion of the second control signal to a control input (e.g., control input 1926) of the third delay device, and outputting a second portion of the second control signal to a control input (e.g., control input 1936) of the fourth delay device.

1. A system, comprising:
   delay locked loop (DLL), comprising:
   a phase detector having a first input, a second input, and an output, wherein the first input of the phase detector is coupled to an input of the DLL;
   a first delay circuit;
   a second delay circuit, wherein the first delay circuit and the second delay circuit are coupled in series between the input of the DLL and the second input of the phase detector;
   a first control circuit having an input, a first output, and a second output, wherein the input of the first control circuit is coupled to the output of the phase detector, the first output of the first control circuit is coupled to a control input of the first delay circuit, and the second output of the first control circuit is coupled to a control input of the second delay circuit;
   a second control circuit having an input and an output, wherein the input of the second control circuit is coupled to the first control circuit; and
   a slave delay circuit having a control input coupled to the output of the second control circuit.
2. The system of clause 1, wherein the first control circuit comprises:
   an accumulator having an input and an output, wherein the input of the accumulator is coupled to the output of the phase detector; and
   a register having an input, a first output, and a second output, wherein the input of the register is coupled to the output of the accumulator, the first output of the register is coupled to the first output of the first control circuit, and the second output of the register is coupled to the second output of the first control circuit.
3. The system of clause 1 or 2, further comprising:
   a latch having a data input, a clock input, and an output, wherein the data input is configured to receive a data signal, and the clock input is coupled to an output of the slave delay circuit.
4. The system of clause 3, further comprising a clock source coupled to an input of the slave delay circuit.
5. The system of any one of clauses 1 to 4, wherein the slave delay circuit comprises:
   a third delay circuit; and
   a fourth delay circuit, wherein the third delay circuit and the fourth delay circuit are coupled in series;
   wherein the output of the second control circuit includes a first output coupled to a control input of the third delay circuit, and a second output coupled to a control input of the fourth delay circuit.
6. The system of any one of clauses 1 to 5, wherein the first control circuit is configured to:
   adjust a first delay control signal based on a phase-error signal from the phase detector;
   output a first portion of the first delay control signal at the first output of the first control circuit; and
   output a second portion of the first delay control signal at the second output of the first control circuit.
7. The system of clause 6, wherein:
   the first delay control signal comprises a digital code; and
   the first control circuit is configured to increment the digital code if the phase-error signal has a first value, and decrement the digital code if the phase-error signal has a second value.
8. The system of clause 6 or 7, wherein:
   the first delay circuit is configured to adjust a first delay with a first delay step based on the first portion of the first delay control signal; and
   the second delay circuit is configured to adjust a second delay with a second delay step based on the second portion of the first delay control signal, wherein the second delay step is a multiple of the first delay step.
9. The system of any one of clauses 6 to 8, wherein the second control circuit is configured to:
   receive the first delay control signal from the first control circuit;
   generate a second delay control signal based on the first delay control signal and a third delay control signal; and
   output the second delay control signal to the control input of the slave delay circuit.
10. The system of clause 9, wherein the third delay control signal comprises a ratio of a delay for the slave delay circuit over a period of a reference clock signal.
11. The system of any one of clauses 6 to 10, wherein the first delay circuit comprises multiple delay devices, and the first delay circuit is configured to selectively place a number of the multiple delay devices in a delay path of the first delay circuit based on the first portion of the first delay control signal.
12. The system of clause 11, wherein the second delay circuit comprises:
   a ring oscillator; and
   a counter configured to count periods of the ring oscillator based on the second portion of the first delay control signal.
13. The system of any one of clauses 1 to 12, wherein second control circuit comprises:
   a multiplier having a first input, a second input, and an output, wherein the first input of the multiplier is coupled to the input of the second control circuit, and the second input of the multiplier is configured to receive a third delay control signal; and
   a quantizer having an input and an output, wherein the input of the quantizer is coupled to the output of the multiplier, and the output of the quantizer is coupled to the output of the second control circuit.
14. The system of clause 13, wherein the third delay control signal comprises a ratio of a delay for the slave delay circuit over a period of a reference clock signal.
15. The system of any one of clauses 1 to 4 and 6 to 14, wherein the DLL further comprises:
   a third delay circuit, wherein the first delay circuit, the second delay circuit, and the third delay circuit are coupled in series between the input of the DLL and the second input of the phase detector, and the first control circuit has a third output coupled to a control input of the third delay circuit.
16. The system of clause 15, wherein the slave delay circuit comprises:
   a fourth delay circuit; and
   a fifth delay circuit, wherein the fourth delay circuit and the fifth delay circuit are coupled in series;
   wherein the output of the second control circuit includes a first output coupled to a control input of the fourth delay circuit, and a second output coupled to a control input of the fifth delay circuit.

17. The system of clause 16, wherein the first control circuit is configured to:
adjust a first delay control signal based on a phase-error signal from the phase detector;
output a first portion of the first delay control signal at the first output of the first control circuit;
output a second portion of the first delay control signal at the second output of the first control circuit; and
output a third portion of the first delay control signal at the third output of the first control circuit.

18. The system of clause 16 or 17, wherein the second control circuit is configured to:
receive the first delay control signal from the first control circuit;
generate a second delay control signal based on the first delay control signal and a third delay control signal; and
output a first portion of the second delay control signal at the first output of the second control circuit, and output a second portion of the second delay control signal at the second output of the second control circuit.

19. The system of clause 18, wherein the third delay control signal comprises a ratio of a delay for the slave delay circuit over a period of a reference clock signal.

20. The system of any one of clauses 16 to 19, wherein the fourth delay circuit comprises multiple delay devices, and the fourth delay circuit is configured to selectively place a number of the multiple delay devices in a delay path of the fourth delay circuit based on the second portion of the second delay control signal.

21. The system of clause 20, wherein the third delay devices comprises a delay interpolator.

22. A method of operating a system including a delay locked loop (DLL) and a slave delay circuit, the DLL including a phase detector, a first delay circuit, and a second delay circuit, wherein a first input of the phase detector is coupled to an input of the DLL, and the first delay circuit and the second delay circuit are coupled in series between the input of the DLL and a second input of the phase detector, the method comprising:
receiving a phase-error signal from an output of the phase detector;
adjusting a first delay control signal based on the phase-error signal;
outputting a first portion of the first delay control signal to a control input of the first delay circuit;
outputting a second portion of the first delay control signal to a control input of the second delay circuit;
generating a second delay control signal based on the first delay control signal; and
outputting the second delay control signal to a control input of the slave delay circuit.

23. The method of clause 22, wherein:
the first delay control signal comprises a digital code; and
adjusting the first delay control signal comprises:
incrementing the digital code if the phase-error signal has a first value; and
decrementing the digital code if the phase-error signal has a second value.

24. The method of clause 23, wherein:
the first delay circuit is configured to adjust a first delay with a first delay step based on the first portion of the first delay control signal; and
the second delay circuit is configured to adjust a second delay with a second delay step based on the second portion of the first delay control signal, wherein the second delay step is a multiple of the first delay step.

25. The method of any one of clauses 22 to 24, wherein:
the DLL further comprises a third delay circuit;
the first delay circuit, the second delay circuit, and the third delay circuit are coupled in series between the input of the DLL and the second input of the phase detector; and
the method further comprises outputting a third portion of the first delay control signal to a control input of the third delay circuit.

26. The method of clause 25, wherein:
the first delay circuit is configured to adjust a first delay with a first delay step based on the first portion of the first delay control signal;
the second delay circuit is configured to adjust a second delay with a second delay step based on the second portion of the first delay control signal;
the third delay circuit is configured to adjust a third delay with a third delay step based on the third portion of the first delay control signal;
the second delay step is a first multiple of the first delay step; and
the first delay step is a second multiple of the third delay step.

27. The method of any one of clauses 22 to 26, wherein generating the second delay control signal based on the first delay control signal comprises:
multiplying the first delay control signal with a third delay control signal.

28. The method of clause 27, wherein the third delay control signal comprises a ratio of a delay for the slave delay circuit over a period of a reference clock signal.

29. The method of any one of clauses 22 to 24, 27, and 28, wherein the slave delay circuit includes a third delay circuit, and a fourth delay circuit coupled in series with the third delay circuit, and wherein outputting the second delay control signal comprises:
outputting a first portion of the second control signal to a control input of the third delay device; and
outputting a second portion of the second control signal to a control input of the fourth delay device.

It is to be appreciated that the present disclosure is not limited to the exemplary terminology used above to describe aspects of the present disclosure. For example, a delay device may also be referred to as a delay stage, a delay buffer, a delay element, a delay unit, or another term. A control circuit may also be referred to a controller, control logic, a control circuit, or another term. A delay circuit may also be referred to as a delay line, or another term. A delay step may also be referred to as a delay unit, or another term. A phase detector may also be referred to as a phase detector, a phase comparator, or another term.

The decoder 250, 1540, the first control circuit 440, the second control circuit 340, and the accumulator 810 may each be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Any reference to an element herein using a designation such as "first," "second," and so forth does not generally limit the quantity or order of those elements. Rather, these designations are used herein as a convenient way of distinguishing between two or more elements or instances of an element. For example, the first delay circuit 1920 and the second delay circuit 1930 of the slave delay circuit 350 may also be referred to as the third delay circuit and the fourth delay circuit, respectively, or referred to as the fourth delay circuit and the fifth delay circuit, respectively, to distinguish these delay circuits from the delay circuits in the segmented delay circuit 410. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a DC ground or an AC ground, and thus the term "ground" covers both possibilities.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system, comprising:
   delay locked loop (DLL), comprising:
      a phase detector having a first input, a second input, and an output, wherein the first input of the phase detector is coupled to an input of the DLL;
      a first delay circuit;
      a second delay circuit, wherein the first delay circuit and the second delay circuit are coupled in series between the input of the DLL and the second input of the phase detector;
      a first control circuit having an input, a first output, and a second output, wherein the input of the first control circuit is coupled to the output of the phase detector, the first output of the first control circuit is coupled to a control input of the first delay circuit, and the second output of the first control circuit is coupled to a control input of the second delay circuit;
      a second control circuit having an input and an output, wherein the input of the second control circuit is coupled to the first control circuit; and
      a slave delay circuit having a control input coupled to the output of the second control circuit.

2. The system of claim 1, wherein the first control circuit comprises:
   an accumulator having an input and an output, wherein the input of the accumulator is coupled to the output of the phase detector; and
   a register having an input, a first output, and a second output, wherein the input of the register is coupled to the output of the accumulator, the first output of the register is coupled to the first output of the first control circuit, and the second output of the register is coupled to the second output of the first control circuit.

3. The system of claim 1, further comprising:
   a latch having a data input, a clock input, and an output, wherein the data input is configured to receive a data signal, and the clock input is coupled to an output of the slave delay circuit.

4. The system of claim 3, further comprising a clock source coupled to an input of the slave delay circuit.

5. The system of claim 1, wherein the slave delay circuit comprises:
   a third delay circuit; and
   a fourth delay circuit, wherein the third delay circuit and the fourth delay circuit are coupled in series;
   wherein the output of the second control circuit includes a first output coupled to a control input of the third delay circuit, and a second output coupled to a control input of the fourth delay circuit.

6. The system of claim 1, wherein the first control circuit is configured to:
   adjust a first delay control signal based on a phase-error signal from the phase detector;
   output a first portion of the first delay control signal at the first output of the first control circuit; and
   output a second portion of the first delay control signal at the second output of the first control circuit.

7. The system of claim 6, wherein:
   the first delay control signal comprises a digital code; and
   the first control circuit is configured to increment the digital code if the phase-error signal has a first value, and decrement the digital code if the phase-error signal has a second value.

8. The system of claim 6, wherein:
   the first delay circuit is configured to adjust a first delay with a first delay step based on the first portion of the first delay control signal; and
   the second delay circuit is configured to adjust a second delay with a second delay step based on the second portion of the first delay control signal, wherein the second delay step is a multiple of the first delay step.

9. The system of claim 6, wherein the second control circuit is configured to:
   receive the first delay control signal from the first control circuit;
   generate a second delay control signal based on the first delay control signal and a third delay control signal; and
   output the second delay control signal to the control input of the slave delay circuit.

10. The system of claim 9, wherein the third delay control signal comprises a ratio of a delay for the slave delay circuit over a period of a reference clock signal.

11. The system of claim 6, wherein the first delay circuit comprises multiple delay devices, and the first delay circuit is configured to selectively place a number of the multiple delay devices in a delay path of the first delay circuit based on the first portion of the first delay control signal.

12. The system of claim 11, wherein the second delay circuit comprises:
   a ring oscillator; and
   a counter configured to count periods of the ring oscillator based on the second portion of the first delay control signal.

13. The system of claim 1, wherein second control circuit comprises:
   a multiplier having a first input, a second input, and an output, wherein the first input of the multiplier is coupled to the input of the second control circuit, and the second input of the multiplier is configured to receive a third delay control signal; and
a quantizer having an input and an output, wherein the input of the quantizer is coupled to the output of the multiplier, and the output of the quantizer is coupled to the output of the second control circuit.

14. The system of claim 13, wherein the third delay control signal comprises a ratio of a delay for the slave delay circuit over a period of a reference clock signal.

15. The system of claim 1, wherein the DLL further comprises:
a third delay circuit, wherein the first delay circuit, the second delay circuit, and the third delay circuit are coupled in series between the input of the DLL and the second input of the phase detector, and the first control circuit has a third output coupled to a control input of the third delay circuit.

16. The system of claim 15, wherein the slave delay circuit comprises:
a fourth delay circuit; and
a fifth delay circuit, wherein the fourth delay circuit and the fifth delay circuit are coupled in series;
wherein the output of the second control circuit includes a first output coupled to a control input of the fourth delay circuit, and a second output coupled to a control input of the fifth delay circuit.

17. The system of claim 16, wherein the first control circuit is configured to:
adjust a first delay control signal based on a phase-error signal from the phase detector;
output a first portion of the first delay control signal at the first output of the first control circuit;
output a second portion of the first delay control signal at the second output of the first control circuit; and
output a third portion of the first delay control signal at the third output of the first control circuit.

18. The system of claim 16, wherein the second control circuit is configured to:
receive the first delay control signal from the first control circuit;
generate a second delay control signal based on the first delay control signal and a third delay control signal; and
output a first portion of the second delay control signal at the first output of the second control circuit, and output a second portion of the second delay control signal at the second output of the second control circuit.

19. The system of claim 18, wherein the third delay control signal comprises a ratio of a delay for the slave delay circuit over a period of a reference clock signal.

20. The system of claim 16, wherein the fourth delay circuit comprises multiple delay devices, and the fourth delay circuit is configured to selectively place a number of the multiple delay devices in a delay path of the fourth delay circuit based on the second portion of the second delay control signal.

21. The system of claim 20, wherein the third delay devices comprises a delay interpolator.

22. A method of operating a system including a delay locked loop (DLL) and a slave delay circuit, the DLL including a phase detector, a first delay circuit, and a second delay circuit, wherein a first input of the phase detector is coupled to an input of the DLL, and the first delay circuit and the second delay circuit are coupled in series between the input of the DLL and a second input of the phase detector, the method comprising:

receiving a phase-error signal from an output of the phase detector;
adjusting a first delay control signal based on the phase-error signal;
outputting a first portion of the first delay control signal to a control input of the first delay circuit;
outputting a second portion of the first delay control signal to a control input of the second delay circuit;
generating a second delay control signal based on the first delay control signal; and
outputting the second delay control signal to a control input of the slave delay circuit.

23. The method of claim 22, wherein:
the first delay control signal comprises a digital code; and
adjusting the first delay control signal comprises:
incrementing the digital code if the phase-error signal has a first value; and
decrementing the digital code if the phase-error signal has a second value.

24. The method of claim 23, wherein:
the first delay circuit is configured to adjust a first delay with a first delay step based on the first portion of the first delay control signal; and
the second delay circuit is configured to adjust a second delay with a second delay step based on the second portion of the first delay control signal, wherein the second delay step is a multiple of the first delay step.

25. The method of claim 22, wherein:
the DLL further comprises a third delay circuit;
the first delay circuit, the second delay circuit, and the third delay circuit are coupled in series between the input of the DLL and the second input of the phase detector; and
the method further comprises outputting a third portion of the first delay control signal to a control input of the third delay circuit.

26. The method of claim 25, wherein:
the first delay circuit is configured to adjust a first delay with a first delay step based on the first portion of the first delay control signal;
the second delay circuit is configured to adjust a second delay with a second delay step based on the second portion of the first delay control signal;
the third delay circuit is configured to adjust a third delay with a third delay step based on the third portion of the first delay control signal;
the second delay step is a first multiple of the first delay step; and
the first delay step is a second multiple of the third delay step.

27. The method of claim 22, wherein generating the second delay control signal based on the first delay control signal comprises:
multiplying the first delay control signal with a third delay control signal.

28. The method of claim 27, wherein the third delay control signal comprises a ratio of a delay for the slave delay circuit over a period of a reference clock signal.

29. The method of claim 22, wherein the slave delay circuit includes a third delay circuit, and a fourth delay circuit coupled in series with the third delay circuit, and wherein outputting the second delay control signal comprises:
outputting a first portion of the second control signal to a control input of the third delay device; and outputting a second portion of the second control signal to a control input of the fourth delay device.

\* \* \* \* \*